(12) United States Patent
Prabhakar et al.

(10) Patent No.: US 11,367,481 B2
(45) Date of Patent: Jun. 21, 2022

(54) SILICON-OXIDE-NITRIDE-OXIDE-SILICON BASED MULTI-LEVEL NON-VOLATILE MEMORY DEVICE AND METHODS OF OPERATION THEREOF

(71) Applicant: Cypress Semiconductor Corporation, San Jose, CA (US)

(72) Inventors: Venkataraman Prabhakar, Pleasanton, CA (US); Krishnaswamy Ramkumar, San Jose, CA (US); Vineet Agrawal, San Jose, CA (US); Long Hinh, San Jose, CA (US); Swatilekha Saha, San Jose, CA (US); Santanu Kumar Samanta, West Bengal (IN); Michael Amundson, Woodinville, WA (US); Ravindra M. Kapre, San Jose, CA (US)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 17/330,179

(22) Filed: May 25, 2021

(65) Prior Publication Data

US 2021/0350850 A1 Nov. 11, 2021

Related U.S. Application Data

(63) Continuation of application No. 16/827,948, filed on Mar. 24, 2020, now Pat. No. 11,017,851.

(Continued)

(51) Int. Cl.
*G11C 11/56* (2006.01)
*G06N 3/063* (2006.01)
(Continued)

(52) U.S. Cl.
CPC ........ *G11C 11/5671* (2013.01); *G06N 3/0635* (2013.01); *G11C 16/0483* (2013.01);
(Continued)

(58) Field of Classification Search
CPC ............ G11C 11/5671; G11C 16/3409; G11C 16/3413; G11C 16/3445; G11C 16/3459
See application file for complete search history.

(56) References Cited

U.S. PATENT DOCUMENTS

| 4,627,027 | A | 12/1986 | Rai et al. | |
|---|---|---|---|---|
| 2003/0198086 | A1* | 10/2003 | Shukuri | ............ H01L 29/40117 257/E21.679 |
| 2019/0013324 | A1 | 1/2019 | Shih et al. | |

* cited by examiner

*Primary Examiner* — Han Yang

(57) ABSTRACT

A semiconductor inference device that has a non-volatile memory (NVM) array including NVM cells arranged in rows and columns, in which each NVM cell comprises a charge trapping transistor configured to store one of N×analog values corresponding to N×levels of its drain current (ID) or threshold voltage (VT) levels, representing N×weight values for multiply accumulate (MAC) operations. The semiconductor inference device also includes digital-to-analog (DAC) function and multiplexor (mux) function configured to generate an analog MAC result based on the digital inputs converted results and the weight values read results, and analog-to-digital (ADC) function configured to convert the analog MAC result of the mux function to a digital value. Other embodiments of the semiconductor inference device and related methods and systems are also disclosed.

21 Claims, 20 Drawing Sheets

FIG. 14

Related U.S. Application Data

(60) Provisional application No. 62/940,547, filed on Nov. 26, 2019.

(51) Int. Cl.
  *G11C 16/04* (2006.01)
  *G11C 16/08* (2006.01)
  *G11C 16/16* (2006.01)
  *G11C 16/24* (2006.01)
  *G11C 16/26* (2006.01)
  *G11C 16/34* (2006.01)
  *H01L 27/11524* (2017.01)
  *H01L 27/11529* (2017.01)
  *H01L 27/1157* (2017.01)
  *H01L 27/11573* (2017.01)
  *H01L 29/66* (2006.01)
  *H01L 29/78* (2006.01)
  *H01L 29/792* (2006.01)

(52) U.S. Cl.
  CPC .............. *G11C 16/08* (2013.01); *G11C 16/16* (2013.01); *G11C 16/24* (2013.01); *G11C 16/26* (2013.01); *G11C 16/3445* (2013.01); *G11C 16/3459* (2013.01); *H01L 27/1157* (2013.01); *H01L 27/11524* (2013.01); *H01L 27/11529* (2013.01); *H01L 27/11573* (2013.01); *H01L 29/6659* (2013.01); *H01L 29/66833* (2013.01); *H01L 29/7833* (2013.01); *H01L 29/7923* (2013.01)

| WLS0 | BL0 | WL0 | SPW | DNW | CSL0 | WLS1 | BL1 | WL1 |
|---|---|---|---|---|---|---|---|---|
| $V_{SENEG}$ | $V_{SEPOS}$ | $V_{EINHIB}$ | $V_{EINHIB}$ | $V_{SEPOS}$ | Ground | Ground | $V_{EINHIB}$ | $V_{EINHIB}$ |
| e.g. -2.3V | e.g. +4.9V | e.g. -1.4V | e.g. -1.4V | e.g. +4.9V | e.g. 0V | e.g. 0V | e.g. -1.4V | e.g. -1.4V |

WLS Pulse duration: Tsse ~ 20 µs

Refill Program Operation
(Page 0 Selected to be Programmed/
Inhibited,
Page 1 is NOT Selected)

| WLS0 | BL0 | WL0 | SPW | DNW | CSL0 | WLS1 | BL1 | WL1 |
|---|---|---|---|---|---|---|---|---|
| $V_{RPPOS}$ e.g. +5.0V | $V_{RPNEG}$ e.g. -4.0V | $V_{RPNEG}$ e.g. -4.0V | $V_{RPNEG}$ e.g. -4.0V | $V_{INHIB}$ e.g. +1.1V | Float/ $V_{SSL}$ -2.4V /$V_{MARG}$ -2.6V | $V_{MARG}$ e.g. -2.6V | $V_{INHIB}$ e.g. +1.1V | $V_{RPNEG}$ e.g. -4.0V |

WLS Pulse duration: Trp ~ 5 μs

SILICON-OXIDE-NITRIDE-OXIDE-SILICON BASED MULTI-LEVEL NON-VOLATILE MEMORY DEVICE AND METHODS OF OPERATION THEREOF

CROSS-REFERENCE TO RELATED APPLICATIONS

This application is a Continuation of U.S. patent application Ser. No. 16/827,948, filed on Mar. 24, 2020, now U.S. Pat. No. 11,017,851, issued on May 25, 2021, which claims the priority and benefit under 35 U.S.C. § 119(e) of U.S. Provisional Application No. 62/940,547, filed on Nov. 26, 2019, which is incorporated by reference herein in its entirety.

TECHNICAL FIELD

The present disclosure relates generally to non-volatile memory devices, and more particularly to utilizing multi-level silicon (semiconductor)-oxide-nitride-oxide-silicon (semiconductor) (SONOS) based charge-trapping non-volatile memory (NVM) devices for analog operations including neuromorphic computing in artificial intelligence (AI) applications.

BACKGROUND

Non-volatile memories are widely used for storing data in computer systems, and typically include a memory array with a large number of memory cells arranged in rows and columns. In some embodiments, each of the memory cells may include at least a non-volatile element, such as charge trapping field-effect transistor (FET), floating gate transistor, that is programmed or erased by applying a voltage of the proper polarity, magnitude and duration between a control/memory gate and the substrate or drain/source regions. For example, in an n-channel charge trapping FET, a positive gate-to-substrate voltage bias causes electrons to tunnel from the channel and trapped in a charge-trapping dielectric layer by Fowler-Nordheim (FN) tunneling, raising a threshold voltage ($V_T$) of the transistor. A negative gate-to-channel voltage causes holes to tunnel from the channel and trapped in the charge-trapping dielectric layer, lowering the $V_T$ of the SONOS transistor.

In some embodiments, SONOS based memory arrays are utilized and operated as digital data storage devices wherein binary bit (0 and 1) data, based on the SONOS cells' two distinct $V_T$ or drain current ($I_D$) levels or values, are stored.

There are demands to use NVM technology, such as SONOS, for analog memory and processing as they possess configurably multiple $V_T$ and $I_D$ (more than two) levels with achievably high precision. SONOS memory cells deliver low latency, power, and noise operations that are desirable for analog processing, including at edge inference computations, such as neuromorphic computing in artificial intelligence (AI) applications.

It is, therefore, an object of the present invention to provide an optimized biasing conditions, operation (erase, program, inhibit, etc.) sequences, and SONOS based analog NVM device and system to achieve tuning of multiple fine $V_T/I_D$ levels with tight and distinct distributions (low distribution sigma "σ").

BRIEF DESCRIPTION OF THE DRAWINGS

The present invention will be understood more fully from the detailed description that follows and from the accompanying drawings and the appended claims provided below, where:

DETAILED DESCRIPTION

Figure 1A:
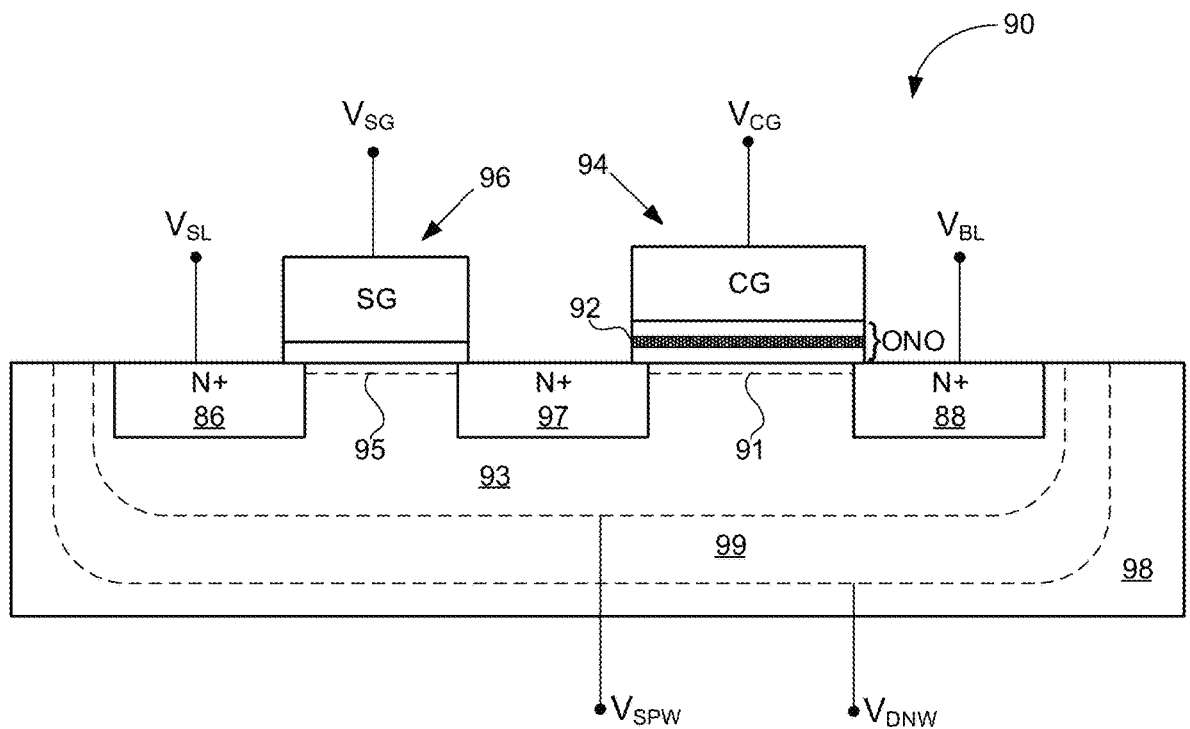
FIG. 1A is a block diagram illustrating a cross-sectional side view of a SONOS based non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

SUMMARY OF SUBJECT MATTER

According to one embodiment of a method of operating a semiconductor device, the method may include the steps of obtaining the semiconductor device including multi-level memory transistors arranged in rows and columns, wherein the multi-level memory transistors include silicon-oxide-nitride-oxide-silicon (SONOS) based charge trapping transistors configured to store one of N×analog values corresponding to the N levels of threshold voltage ($V_T$) and drain current ($I_D$), and wherein N is a natural number greater than 2; selecting at least one of the multi-level memory transistor for a write process to a target value, wherein the target value is one of the N×analog values and corresponding to a target $I_D$ range extending from a target $I_D$ lower limit (LL) to a target $I_D$ upper limit (UL); performing a partial program operation on the at least one of the multi-level memory transistor for $I_D$ level reduction, wherein a first verification read is performed after the partial program operation to determine how a reduced $I_D$ level is compared to a target $I_D$ mean; performing a partial erase operation on the at least one of the multi-level memory transistor for $I_D$ level raise, wherein a second verification read is performed after the partial erase operation to determine how a raised $I_D$ level is compared to the target $I_D$ mean; and determining the write process to the target value is completed when the $I_D$ level of the at least one of the multi-level memory transistor falls within the target $I_D$ range.

In one embodiment, the method may also include the step of inhibiting, after the write process to the target value is completed, the at least one of the multi-level memory transistor from further program and erase operations, wherein the inhibiting comprises reducing a magnitude of a gate-to-drain voltage or gate to substrate voltage of the at least one of the multi-level memory transistor.

In one embodiment, the partial program operation may include at least one of a soft program operation and a refill program operation, wherein the partial program operation may be configured to reduce the $I_D$ level and raise a $V_T$ level of the at least one of the multi-level memory transistor, and wherein multi-level memory transistors that are not selected for the partial program operation may be inhibited.

In one embodiment, the partial program operation may be performed for a considerable shorter duration than a program operation, wherein the program operation may be configured to reduce $I_D$ levels of the multi-level memory transistors to a fully programmed $I_D$ level regardless of starting $I_D$ levels of the multi-level memory transistors.

In one embodiment, the partial erase operation may include at least one of a soft erase operation, a selective soft erase operation and an anneal erase operation, wherein the partial erase operation may be configured to raise the $I_D$ level and reduce the $V_T$ level of the at least one of the multi-level memory transistor, and wherein multi-level memory transistors that are not selected for the selective soft erase operation may be inhibited.

In one embodiment, the soft erase operation and the selective soft erase operation may be performed for a considerable shorter duration than an erase operation, wherein the erase operation may be configured to raise $I_D$ levels of the multi-level memory transistors to a fully erased $I_D$ level regardless of starting $I_D$ levels of the multi-level memory transistors.

In one embodiment, the anneal erase operation may be performed for a considerable longer duration than an erase operation, and wherein a magnitude of a gate-to-drain voltage or gate to substrate of the at least one of the multi-level memory transistor during the erase operation may be greater than the anneal erase operation.

In one embodiment, the method may further include a refill and anneal algorithm including the steps of performing, after the write process to the target value is completed, the soft erase operation on the at least one of the multi-level memory transistor; verifying if the $I_D$ level has reached at least a target $I_D$+X % level, wherein X is in a range of 20-50; performing the refill program operation on the at least one of the multi-level memory transistor; verifying if the $I_D$ level has reached at most a target $I_D$-Y % level, wherein Y is in a range of 10-20; performing the anneal erase operation on the at least one of the multi-level memory transistor; verifying the $I_D$ level of each of the at least one of the multi-level memory transistor; selecting and performing the selective soft erase operation only on the at least one of the multi-level memory transistor that has the $I_D$ level less than the target $I_D$ LL and inhibiting unselected multi-level memory transistor; and verifying whether the $I_D$ level of the at least one of the multi-level memory transistor is restored back within the target $I_D$ level range.

In one embodiment, the refill and anneal algorithm may be configured to maintain the $I_D$ level of the at least one of the multi-level memory transistor within the target $I_D$ range while replacing charges in shallow traps by charges in deep traps in a charge trapping layer of the at least one of the multi-level memory transistor, wherein the refill program operation may facilitate deep trap charges by applying a high gate-to-drain voltage and a short program pulse to the at least one of the multi-level memory transistor, and wherein the anneal erase operation may be configured to empty out shallow trap charges via Fowler Nordheim tunneling by applying a low gate-to-drain voltage and a long erase pulse to the at least one of the multi-level memory transistor.

In one embodiment, the at least one of the multi-level memory transistor may be disposed in a same row or a same column.

According to one embodiment of a method to operate a semiconductor device, the method may comprise the steps of selecting a first NVM cell of a SONOS based NVM array for a selective soft erasing operation, wherein the SONOS based NVM array comprises NVM cells arranged in rows and columns, and wherein NVM cells of adjacent first and second columns couple to a first shared source line; generating and coupling a first negative voltage to a first SONOS word line in a first row of the SONOS based NVM array and a positive voltage to a first bit line in the first column to apply a gate-to-drain voltage bias to a first NVM transistor in the first NVM cell to partially erase the first NVM cell by Fowler Nordheim (FN) tunneling, wherein a drain current ($I_D$) level and a threshold voltage ($V_T$) level of the first NVM transistor is respectively raised and reduced; and coupling an inhibit voltage to a second bit line in the second column to reduce the gate-to-drain voltage bias to a second NVM transistor in a second NVM cell in the first row that is unselected for the selective soft erase operation, wherein the inhibit voltage has a same polarity and a magnitude less than the first negative voltage, and wherein the second NVM transistor has an approximately same $I_D$ and $V_T$ levels before and after the selective soft erase operation.

In one embodiment, the method may also include the step of coupling a ground voltage to a second SONOS word line in a second row of the SONOS based NVM array to unselect all NVM cells in the second row for the selective soft erase operation.

In one embodiment, the method may also include the steps of generating and coupling a second negative voltage to a first word line in the first row and a shallow positive well (SPW) node of the SONOS based NVM array to turn off a first field-effect transistor (FET) in the first NVM cell and a second FET in the second NVM cell, wherein the second negative voltage has a magnitude less than the first negative voltage; and coupling the positive voltage to a deep negative well (DNW) node.

In one embodiment, each of the NVM cells may include an NVM transistor configured to store one of N×values corresponding to N×levels of $I_D$ and $V_T$ levels, wherein N is a natural number greater than 2, and wherein the selective soft erase operation may be configured to raise the $I_D$ level and reduce the $V_T$ level of the first NVM transistor such that its stored value changes from a first value to a second value, and wherein the second value may be greater than the first value.

In one embodiment, each of the N×levels of $I_D$ and $V_T$ levels may include a distribution, wherein two adjacent $I_D$ or $V_T$ distributions may have less than 3% overlapping frequency, and wherein the N×levels of $I_D$ and $V_T$ levels may be linearly incremental and decremental, respectively.

According to one embodiment of a semiconductor device, the device may include a SONOS based NVM array including NVM cells arranged in rows and columns, wherein each NVM cell may comprise an NVM transistor and a field-effect transistor (FET), and wherein each NVM transistor may be configured to store N×analog values corresponding to the N×levels of its drain current ($I_D$) or threshold voltage ($V_T$) levels; digital-to-analog (DAC) function that receives and converts digital signals from external devices, wherein the digital signals converted may be configured to cause an analog value stored in at least one NVM cell in at least one column to be read; column multiplexor (mux) function that is configured to select and combine the analog value read from the at least one NVM cell; and analog-to-digital (ADC) function that is configured to convert analog results of the column mux function to digital values and output the digital values.

In one embodiment, the N×analog values may be written to the NVM transistors by a series of partial program and selective partial erase operations, wherein the selective partial erase operations may be configured to raise $I_D$ level and reduce $V_T$ level of selected NVM transistors of a same row and concurrently inhibit unselected NVM transistors in the same row.

In one embodiment, each of the partial program operations and the selective partial erase operations may be followed by a read operation to verify if the $I_D$ or $V_T$ levels of the selected NVM transistors have attained target $I_D$ and $V_T$ levels.

In one embodiment, a plurality of the semiconductor devices may be disposed on a same semiconductor die and coupled to one another, each of the plurality of the semiconductor devices may be configured to perform multiply accumulate (MAC) operations based on the analog values stored in the NVM cells and digital inputs from at least one other semiconductor devices of the plurality of the semiconductor devices.

In one embodiment, a first subset of the plurality of the semiconductor devices output digital results of the MAC operations, and wherein the digital results of the first subset are coupled to a second subset of the plurality of the semiconductor devices as the digital inputs.

In one embodiment, the plurality of the semiconductor devices may be configured to function as artificial neurons in a deep neural network (DNN) performing neuromorphic computing in an artificial intelligence (AI) application.

Description of Embodiments

Figure 1B:
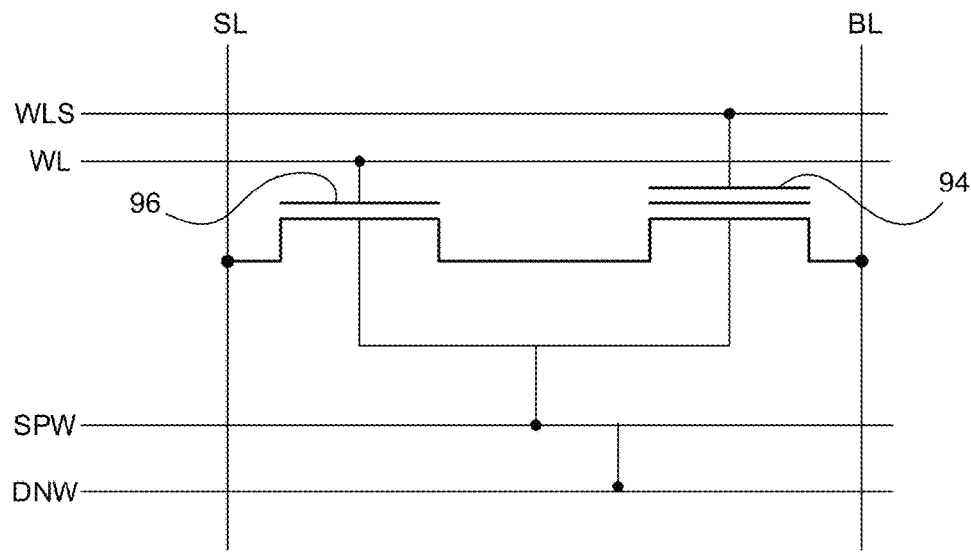
FIG. 1B illustrates a corresponding schematic diagram of the SONOS based non-volatile memory transistor or device depicted in FIG. 1A.

FIG. 1A is a block diagram illustrating a cross-sectional side view of a non-volatile memory cell, and its corresponding schematic diagram is depicted in FIG. 1B. A non-volatile memory (NVM) array or device may include NVM cells with a non-volatile memory transistor or device implemented using Silicon (Semiconductor)-Oxide-Nitride-Oxide-Silicon (Semiconductor) (SONOS) or floating gate technology, and a regular field-effect transistor (FET) disposed adjacent or couple to one another.

In one embodiment, illustrated in FIG. 1A, the non-volatile memory transistor is a SONOS-type charge trapping non-volatile memory transistor. Referring to FIG. 1A, NVM cell 90 includes a control gate (CG) or memory gate (MG) stack of NV transistor 94 formed over substrate 98. NVM cell 90 further includes source 97/drain 88 regions formed in substrate 98, or optionally within shallow positive well (SPW) 93 in substrate 98, on either side of NV transistor 94. SPW 93 may be at least partly encapsulated within deep negative well (DNW) 99. In one embodiment, source/drain regions 88 and 97 are connected by channel region 91 underneath NV transistor 94. NV transistor 94 includes an oxide tunnel dielectric layer, a nitride or oxynitride charge-trapping layer 92, an oxide top or blocking layer, forming the ONO stack. In one embodiment, charge-trapping layer 92 may be multiple layered and traps charges injected from substrate 93 by FN tunneling. $V_T$ and $I_D$ values of NV transistor 94 may change at least partly due to the amount of trapped charges. In one embodiment, a high K dielectric layer may form at least a portion of the blocking layer. A poly-silicon (poly) or metal gate layer disposed overlying the ONO layer, which may serve as a control gate (CG) or memory gate (MG). As best shown in FIG. 1A, NVM cell 90 further includes a FET 96 disposed adjacent to NV transistor 94. In one embodiment, FET 96 includes a metal or polysilicon select gate (SG) disposed overlying an oxide or high-K dielectric gate dielectric layer. FET 96 further includes source/drain regions 86 and 97 formed in substrate 98, or optionally within well 93 in substrate 98, on either side of FET 96. As best shown in FIG. 1A, FET 96 and NV transistor 94 share source/drain region 97 disposed in-between, or referred to as internal node 97. SG is appropriately biased $V_{SG}$ to open or close the channel 95 underneath FET 96. NVM cell 90, as illustrated in FIG. 1A, is considered having a two-transistor (2T) architecture, wherein NV transistor 94 and FET 96 may be considered the memory transistor and the select or pass transistor, respectively throughout this patent document.

In one embodiment, FIG. 1B depicts a two-transistor (2T) SONOS NVM cell 90 with non-volatile (NV) transistor 94 connected in series with FET 96. NVM cell 90 is programmed (bit value "1") when CG is appropriately biased by $V_{CG}$, or by applying a positive pulse on CG with respect to substrate 98 or well 93 that causes electrons to be injected from the inversion layer into charge-trapping layer 92 by FN tunneling. The charge trapped in the charge-trapping layer 92 results in an electron depletion between the drain 88 and the source 97, raising the threshold voltage ($V_T$) necessary to turn on the SONOS based NV transistor 94, putting the device in a "programmed" state. NVM cell 90 is erased by applying an opposite bias $V_{CG}$ on the CG, or a negative pulse on CG, with respect to substrate 98 or well 93 causing FN tunneling of holes from the accumulated channel 91 into the ONO stack. Programmed and erased threshold voltages are called "Vtp" and "Vte" respectively. In one embodiment, NV transistor 94 may also be in an inhibit state (bit value "0") wherein a previously erased cell (bit value "0") is inhibited from being programmed (bit value "1") by applying a positive voltage on the source and drain of NVM cell 90 while control gate (CG) is pulsed positive with respect to substrate 98 or well 93 (as in the program condition). The threshold voltage (referred to as "Vtpi") of NV transistor 94 becomes slightly more positive due to the disturbing vertical field but it remains erased (or inhibited). In one embodiment, Vtpi is also determined by the ability of the charge-trapping layer 92 of the ONO stack to keep the trapped charges (holes for the erased state) in charge-trapping layer 92. If the charge traps are shallow, the trapped charges tend to dissipate and the Vtpi of NV transistor 94 becomes more positive. In one embodiment, Vtpi of NV transistor 94 tends to decay or creep up with further inhibit operations. It will be the understanding that the allocation of bit or binary values "1" and "0" to the respective "programmed" and "erased" states of NVM cell 90 herein is only for explanation purposes, and not to be interpreted as a limitation. The allocation may be reversed or have other arrangements in other embodiments. In another embodiment, as will be explained in detail in later section, NVM cell 90 may be configured to store one of multiple analog values (other than "0" and "1") by manipulating their threshold voltage or drain current levels.

In another embodiment, the NV transistor 94 may be a floating-gate MOS field-effect transistor (FGMOS) or device. Generally, FGMOS is similar in structure to the SONOS based NV transistor 94 described above, differing primarily in that a FGMOS includes a poly-silicon (poly) floating gate, which is capacitively coupled to inputs of the device, rather than a nitride or oxynitride charge-trapping layer 92. Thus, the FGMOS device can be described with reference to FIGS. 1A and 1B, and operated in a similar manner.

Similar to the SONOS based NV transistor 94, the FGMOS device may be programmed by applying an appropriate bias $V_{CG}$ between the control gate and the source and drain regions, raising the threshold voltage $V_T$ necessary to turn on the FGMOS device. The FGMOS device can be erased by applying an opposite bias $V_{CG}$ on the control gate.

In one embodiment, source/drain region 86 may be considered as the "source" of NVM cell 90, and coupled to $V_{SL}$, while source/drain region 88 as the "drain", and coupled to $V_{BL}$. Optionally, SPW 93 is coupled with $V_{SPW}$ and DNW 99 with $V_{DNW}$.

FET 96 may prevent hot carrier electron injection and junction breakdown during program or erase operations. FET 96 may also prevent large currents from flowing between source 86 and drain 88, which may cause high energy consumption and parasitic voltage drops in the memory array. As best shown in FIG. 1A, both FET 96 and NV transistor 94 may be n-type or n-channel transistors, wherein source/drain regions 86, 88, 97, and DNW 99 are doped with n-type material while SPW 93 and/or substrate 98 is doped with p-type material. It will be the understanding that NVM cell 90 may also include, additionally or alternatively, p-type or p-channel transistors, wherein the source/drain regions and well may be doped oppositely, or differently according to the practice of ordinary skill in the art.

A memory array is constructed by fabricating a grid of memory cells, such as NVM cells 90, arranged in rows and columns and connected by a number of horizontal and vertical control lines to peripheral circuitry such as address decoders and comparators such as analog-to-digital (ADC) and digital-to-analog (DAC) functions. Each memory cell includes at least one non-volatile semiconductor device, such as those described above, and may have a one-transistor (1T), or two-transistor (2T) architecture as described in FIG. 1A.

Figure 2:
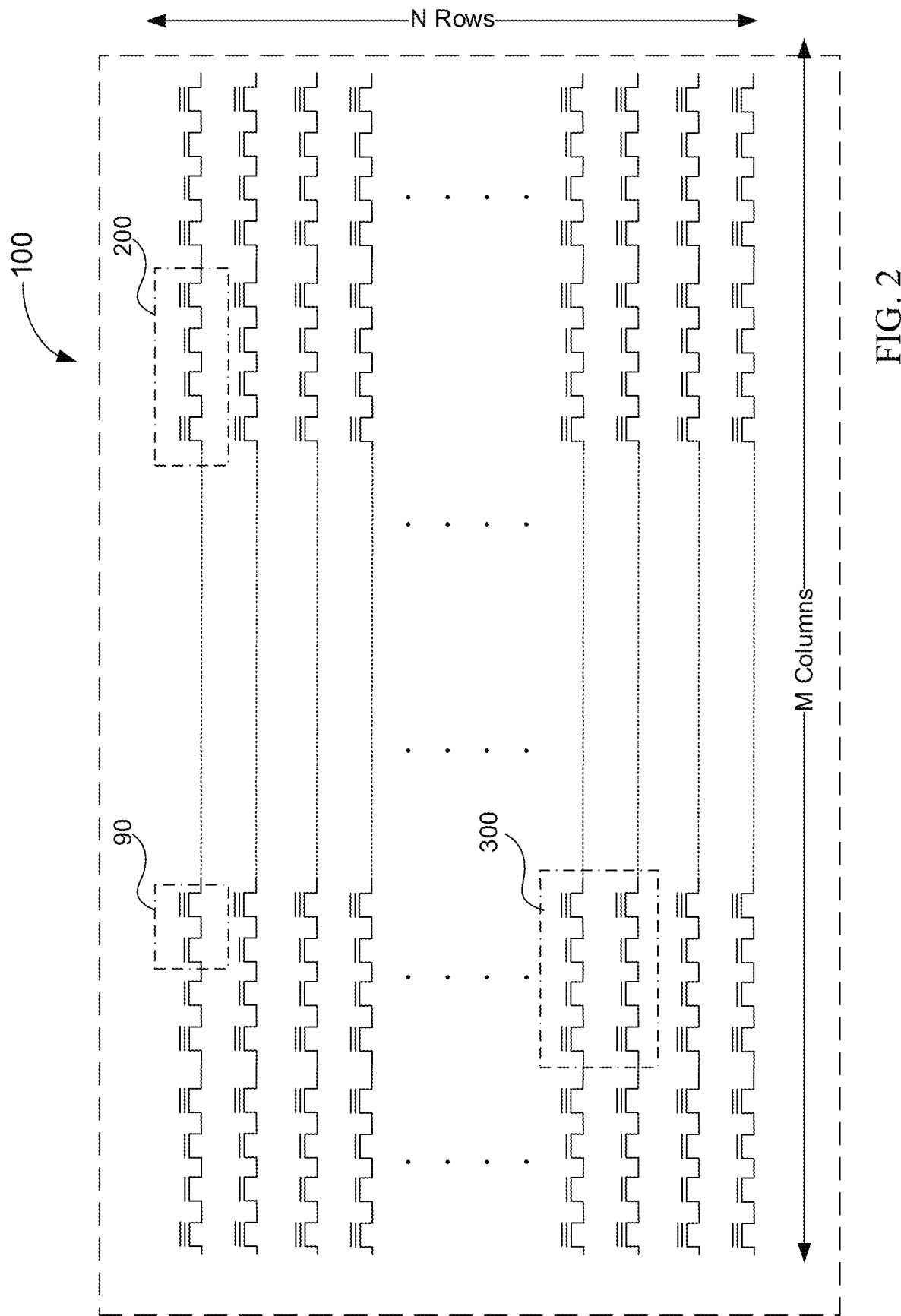
FIG. 2 is a schematic diagram illustrating a SONOS based non-volatile memory array according to one embodiment of the present disclosure.

FIG. 2 is a schematic diagram illustrating an NVM array in accordance with one embodiment of the subject matter. In one embodiment, illustrated in FIG. 2, the memory cell 90 has a 2T architecture and includes, in addition to a non-volatile memory transistor, a pass or select transistor, for example, a conventional MOSFET sharing a common substrate connection, or internal node, with the memory transistor. In one embodiment, NVM array 100 includes NVM cells 90 arranged in N rows or page (horizontal) and M columns (vertical). NVM cells 90 in the same row may be considered to be in the same page. In some embodiments, several rows or pages may be grouped together to form memory sectors. It should be appreciated that the terms "rows" and "columns" of a memory array are used for purposes of illustration, rather than limitation. In one embodiment, rows are arranged horizontally and columns are arranged vertically. In another embodiment, the terms of rows and columns of memory array may be reversed or used in an opposite sense, or arranged in any orientation.

Figure 3A:
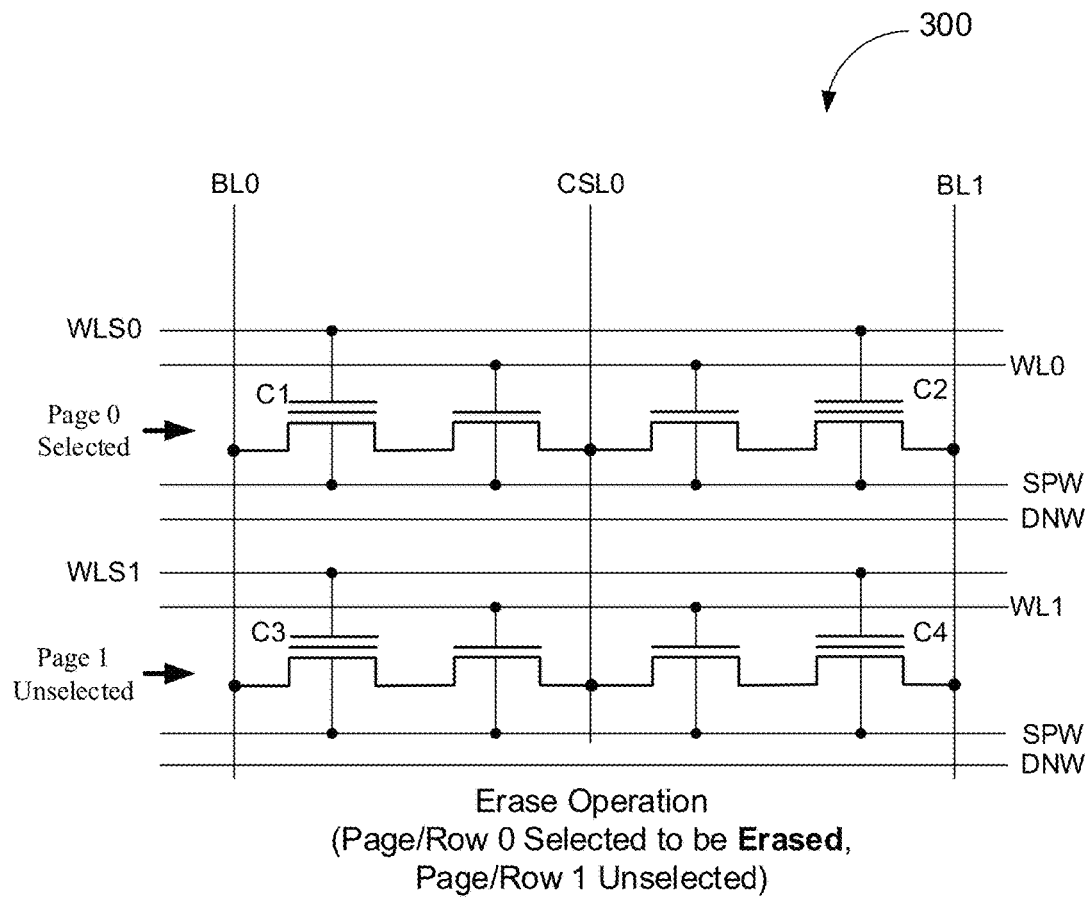
FIG. 3A is a schematic diagram of a segment of a SONOS based non-volatile memory array illustrating an embodiment of an erase operation according to the present disclosure.

In one embodiment, a SONOS word line (WLS) is coupled to all CGs of NVM cells 90 of the same row, a word line (WL) is coupled to all SGs of NVM cells 90 of the same row. A bit lines (BL) are coupled to all drain regions 88 of NVM cells 90 of the same column, while a common source line (CSL) or region 86 is coupled or shared among all NVM cells in the array, in one embodiment. In one alternative embodiment, a CSL may be shared between two paired NVM cells, such as C1 and C2 as best shown in FIG. 3A, of the same row. An CSL also couples to shared source regions of all NVM pairs of the same two columns.

In the flash mode, a write operation may consist of a bulk erase operation on a selected row (page) followed by program or inhibit operations on individual cell(s) in the same row. The smallest block of NVM cells that can be erased at a time is a single page (row). The smallest block of cells that can be programmed/inhibited at a time may also be a single page.

Referring to FIG. 2, NVM cells 90 may be arranged in pairs, such as NVM cell pair 200. In one embodiment, as best shown in FIGS. 3A, 3B, 8A, and 8B, NVM cell pair 200 includes two NVM cells 90 having a mirrored orientation, such that select transistors of each NVM cell, for example C1 and C2, are disposed adjacent to one another. NVM cells 90 of the same NVM cell pair 200 may also share a common source region, receiving the voltage signal $V_{CSL}$.

FIG. 3A illustrates a 2×2 array 300 of NVM array 100 to demonstrate an embodiment of an erase or a hard erase operation according to the present disclosure. As explained earlier, NVM array 100 may adopt a common source-line (CSL) configuration. In one embodiment, one single CSL (e.g. CSL0) is shared among all NVM cells in the NVM array or at least between NVM cells (e.g. C1 and C2) of adjoining columns. In one embodiment, CSLs may be disposed and shared between select transistors of NVM cells 90 of adjacent columns. In the following description, for clarity and ease of explanation, it is assumed that all of the transistors in NVM array 100 including 2×2 array 300 are N-type transistors. It should be appreciated, without loss of generality that a P-type configuration can be described by reversing the polarity of the applied voltages, and that such a configuration is within the contemplated embodiments of the disclosure. In addition, the voltages and pulse durations used in the following description are selected for ease of explanation and represent only one exemplary embodiment of the subject matter. Other voltages may be employed in different embodiments.

FIG. 3A illustrates an exemplary embodiment of a segment of NVM array 100, which may be part of a large memory array of memory cells. In FIG. 3A, 2×2 memory array 300 includes at least four memory cells C1, C2, C3, and C4 arranged in two rows and two columns. While NVM cells C1-C4 may be disposed in two adjacent columns (common source line CSL0), they may be disposed in two adjacent rows, or two non-adjacent rows. Each of the NVM cells C1-C4 may be structurally similar to NVM cell 90 as described above.

Each of NVM cells C1-C4 may include a SONOS based memory transistor and a select transistor. Each of the memory transistors includes a drain coupled to a bit line (e.g. BL0 and BL1), a source coupled to a drain of the select transistor and, through the select transistor, to a single, common source line (e.g. CSL0). Each memory transistor further includes a control gate coupled to a SONOS word line (e.g. WLS0). The select transistors each includes a source coupled to the common source line (e.g. CSL0) and a select gate coupled to a word line (e.g. WL0).

Referring to FIG. 3A, for example, page 0 is selected to be erased and page 1 is not (unselected) for an erase operation. As explained earlier, a single page may be the smallest block of NVM cells 90 that is erased in one operation. Therefore, all NVM cells including C1 and C2 in a selected row (page 0) are erased at once by applying the appropriate voltages to a SONOS word line (WLS0) shared by all NVM cells in the row, the substrate connection and to all bit lines in NVM array 100. In one embodiment, a negative voltage $V_{NEG}$ is applied to WLS0, and a positive voltage $V_{POS}$ is applied to substrate or p-well via SPW and deep n-well DNW of all NVM cells in page 0, all bit lines including BL0 and BL1, and the common source lines including CSL. Therefore, a full erase voltage ($V_{NEG}$-$V_{POS}$) is impressed between CGs and substrate/P-wells of memory transistors in C1 and C2 for a pulse duration (Te~10 ms) to erase any previously trapped charges (if any) therein. In one embodiment, all word lines including WL0 and WL1 are coupled to a supply voltage $V_{PWR}$.

Still referring to FIG. 3A, when a page (row) is not selected for an erase operation, e.g. page 1, a positive voltage $V_{POS}$ is applied to WLS1 instead, such that the CGs to substrate/P-wells of memory transistors in page 1 include C3 and C4 is approximately 0 V ($V_{POS}$-$V_{POS}$). Therefore, the state of NVM cells of page 1 remain unchanged (not erased).

Table I depicts exemplary bias voltages that may be used for a bulk erase operation of page/row 0 of a non-volatile memory having a 2T-architecture and including memory cells with N-type SONOS transistors and CSLs, resembling 2×2 array 300.

TABLE I

| Node | Voltages (V) | Voltage Range (V) |
|------|-------------|-------------------|
| WLS0 | $V_{NEG}$ e.g. −3.8 V | −4.0 V to −3.2 V |
| BL0 | $V_{POS}$ e.g. +4.2 V | +3.8 V to +4.6 V |
| WL0 | $V_{PWR}$ e.g. +1.1 V | +1.0 V to +1.2 V |
| SPW | $V_{POS}$ e.g. +4.2 V | +3.8 V to +4.6 V |
| DNW | $V_{POS}$ e.g. +4.2 V | +3.8 V to +4.6 V |
| CLS0 | $V_{POS}$ e.g. +4.2 V | +3.8 V to +4.6 V |
| WLS1 | $V_{POS}$ e.g. +4.2 V | +3.8 V to +4.6 V |
| BL1 | $V_{POS}$ e.g. +4.2 V | +3.8 V to +4.6 V |
| WL1 | $V_{PWR}$ e.g. +1.1 V | +1.0 V to +1.2 V |

Figure 3B:
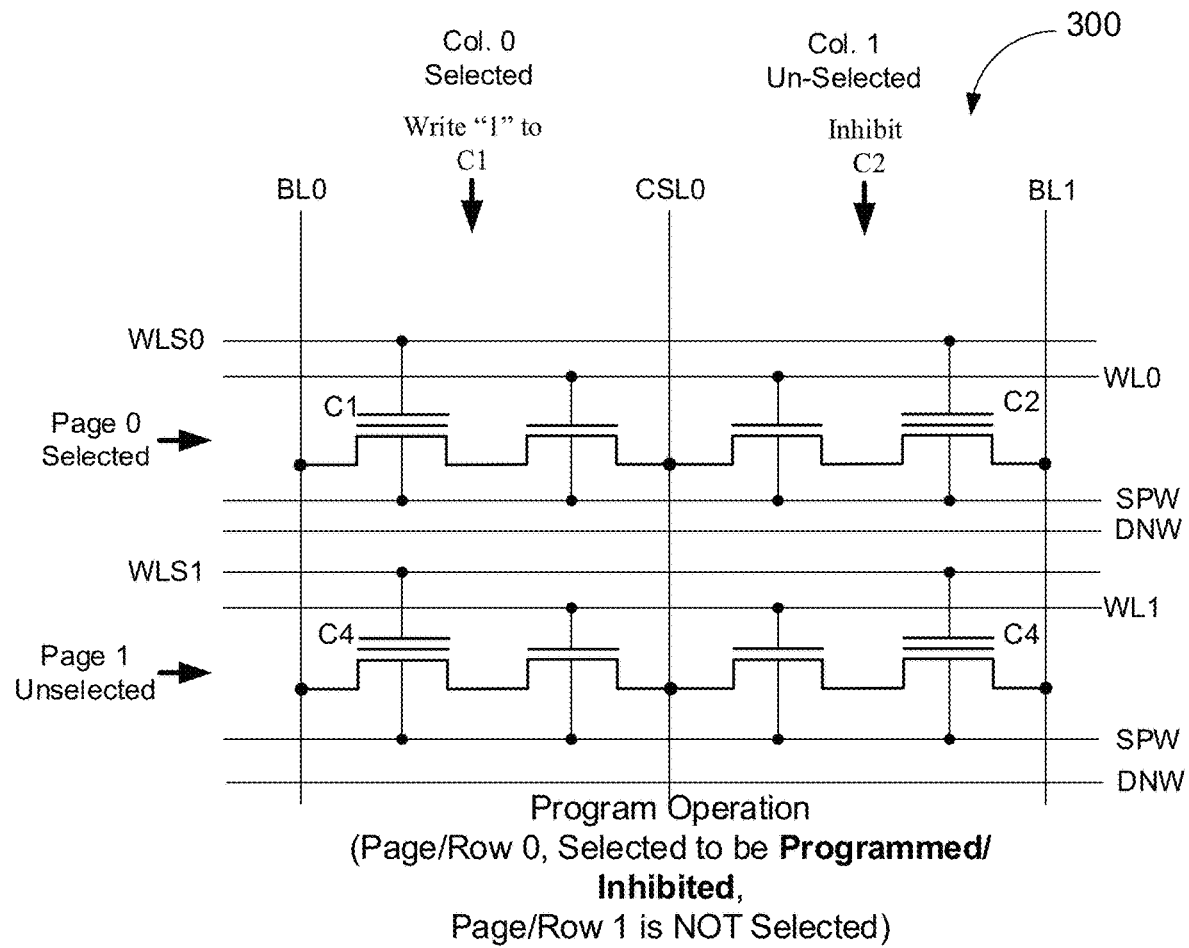
FIG. 3B is a schematic diagram of a segment of a SONOS based non-volatile memory array illustrating an embodiment of a program/inhibit operation according to the present disclosure.

FIG. 3B illustrates an exemplary embodiment of a segment 2×2 array 300 of NVM array 100, during a program or a hard program operation. Referring to FIG. 3B, for example, NVM cell C1 is the targeted cell to be programmed or written to a logic "1" state (i.e., programmed to an OFF state) while NVM cell C2, possibly already erased to a logic "0" state by a preceding erase operation as depicted in FIG. 3A, is maintained in a logic "0" or ON state. It will be the understanding that C1 and C2, while being illustrated as two adjacent cells for illustrative purposes, may also be two separated NVM cells on the same row, such as row 0. These two objectives (programming C1 and inhibiting C2) are accomplished by applying a first or positive high voltage ($V_{POS}$) to WLS0 in page or row 0 of NVM array 100, a second or negative high voltage ($V_{NEG}$), is applied to BL0 to bias memory transistor of C1 on programming the selected memory cell, while an inhibit voltage ($V_{INHIB}$) is applied to BL1 and DNW to bias memory transistor of C2 on inhibiting programming of the unselected memory cell(s), and a common voltage is applied to the shared substrate or p-well SPW of all NVM cells, and the word lines (WL1 and WL2) coupled to the second or negative high voltage ($V_{NEG}$). In one embodiment, the common source line CSL0 between C1 and C2 or among all NVM cells 90 may be at a third high voltage or CSL voltage ($V_{CSL}$), or allowed to float. In one embodiment, third high voltage $V_{CSL}$ may have a voltage level or absolute magnitude less than $V_{POS}$ or $V_{NEG}$. In one embodiment, $V_{CSL}$ may be generated by its own dedicated circuitry including DAC in the memory device (not shown). $V_{CSL}$ may have an approximately same voltage level or absolute magnitude as margin voltage $V_{MARG}$, which will be discussed in further detail in later sections. When $V_{POS}$ via WLS0 is applied to the memory transistor of C2, the positive $V_{INHIB}$ on BL1 is transferred to its channel. This voltage reduces the gate-to-drain/channel voltage bias on the memory transistor of C2, reducing the programming field so that the shift in threshold voltage from Vte is small. The tunneling of charges that may still occur is known as the inhibit disturb, and is quantified as (Vte-Vtpi). In one embodiment, as a result of the program operation, all NVM cells of page 0 including C1 and C2, may attain a binary state of "1" (programmed-Vtp) or "0" (inhibited-Vtpi) based on the bit line voltage the NVM cell receives. NVM cells in unselected pages, such as page 1, may remain the binary state of "0" (erased-Vte).

In addition, and as described in greater detail below, a selected margin voltage ($V_{MARG}$) having a voltage level or absolute magnitude less than $V_{NEG}$ is applied to WLS1 in an unselected row or page (e.g. page 1) to reduce or substantially eliminate program-state bit line disturb in the unselected NVM cell C4 due to programming of the selected C1. In one embodiment, the absolute voltage level or magnitude of $V_{MARG}$ may be the same as $V_{CSL}$.

Table II depicts exemplary bias voltages that may be used for programming a non-volatile memory having a 2T-architecture and including memory cells with N-type SONOS transistors and CSLs.

TABLE II

| Node | Voltages (V) | Voltage Range (V) |
|---|---|---|
| WLS0 | $V_{POS}$ e.g. +4.2 V | +3.8 V to +4.6 V |
| BL0 | $V_{NEG}$ e.g. −3.8 V | −4.0 V to −3.4 V |
| WL0 | $V_{NEG}$ e.g. −3.8 V | −4.0 V to −3.4 V |
| SPW | $V_{NEG}$ e.g. −3.8 V | −4.0 V to −3.4 V |
| DNW | $V_{INHIB}$ e.g. +1.1 V | +1.0 V to +1.2 V |
| CLS0 | Float/$V_{MARG}$ e.g. −2.4 V | −3.0 V to −2.0 V |
| WLS1 | $V_{MARG}$ e.g. −2.4 V | −3.0 V to −2.0 V |
| BL1 | $V_{INHIB}$ e.g. +1.1 V | +1.0 V to +1.2 V |
| WL1 | $V_{NEG}$ e.g. −3.8 V | −4.0 V to −3.4 V |

Generally, the margin voltage ($V_{MARG}$) has the same polarity as the second high voltage or $V_{NEG}$, but is higher or more positive than $V_{NEG}$ by a voltage equal to at least the threshold voltage ($V_T$) of the memory transistors for which program state bit line disturb is reduced.

Figure 4:
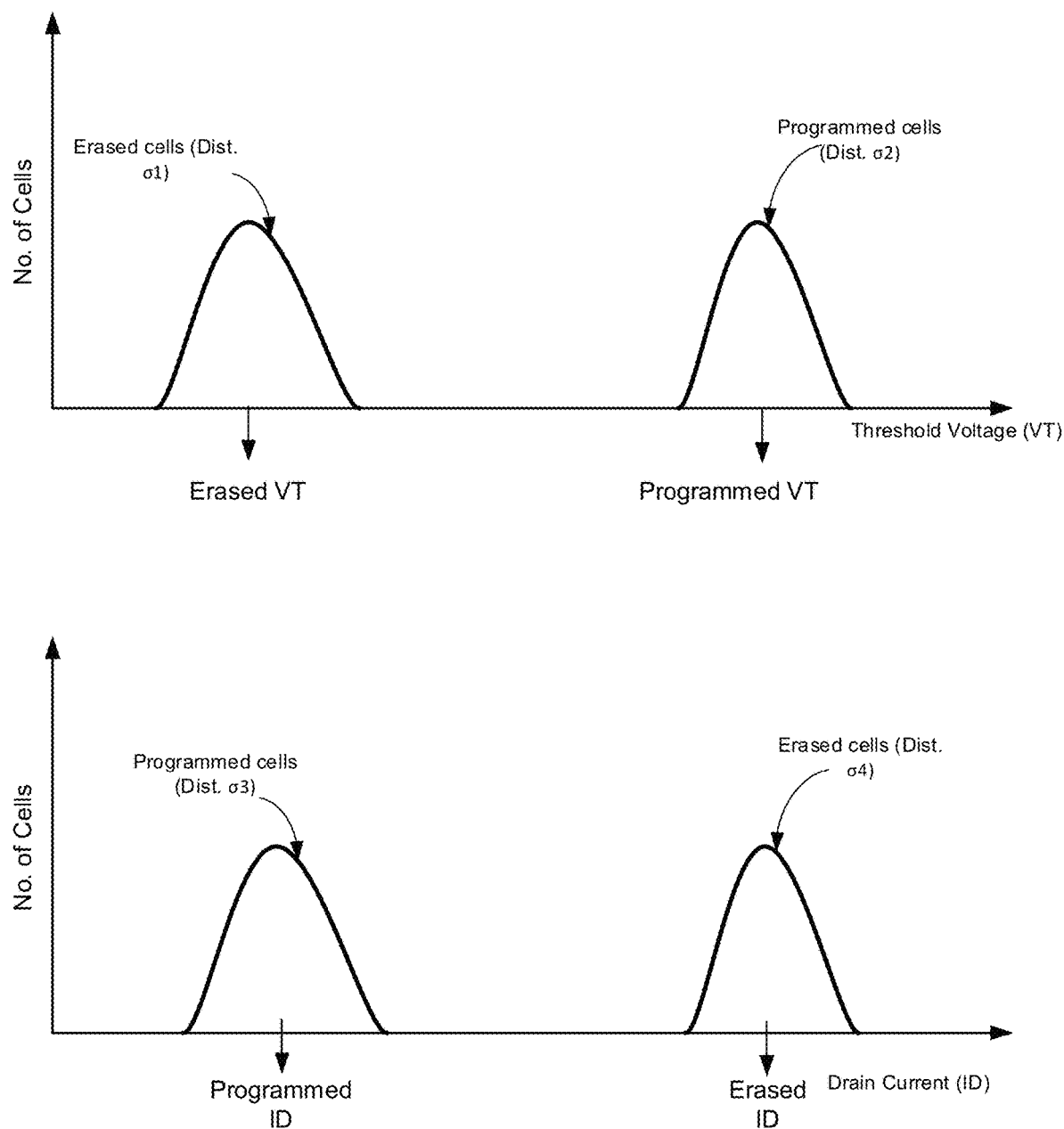
FIG. 4 are representative graphs illustrating distribution of threshold voltages and drain currents of programmed (Vtp and Idp) and erased (Vte and Ide) of memory transistors in a SONOS based non-volatile memory array according to an embodiment of the present disclosure.

FIG. 4 shows the Vtp and Vte, and drain current programmed ($I_{DP}$) and drain current erased ($I_{DE}$) distributions in an exemplary SONOS based NVM array, such as NVM array 100. A typical write operation includes an erase or a hard erase operation as described in FIG. 3A and followed by a hard program/inhibit operation as described in FIG. 3B. In one embodiment, after a reliable read operation, NVM cell may be determined to be in one of the two distinct binary states ("0" or "1"). The erase operation as described in FIG. 3A may also be considered a hard erase because it causes to move the $V_T/I_D$ of the erased NVM cells (e.g. C1 and C2) to the Erased $V_T/I_D$ levels (a complete erase), regardless of the starting $V_T/I_D$ levels of those cells. Similarly, the program operation as described in FIG. 3B may be considered a hard program operation. In one embodiment, there may be no verification or read operation between the hard erase and hard program/inhibit operations.

Figure 5:
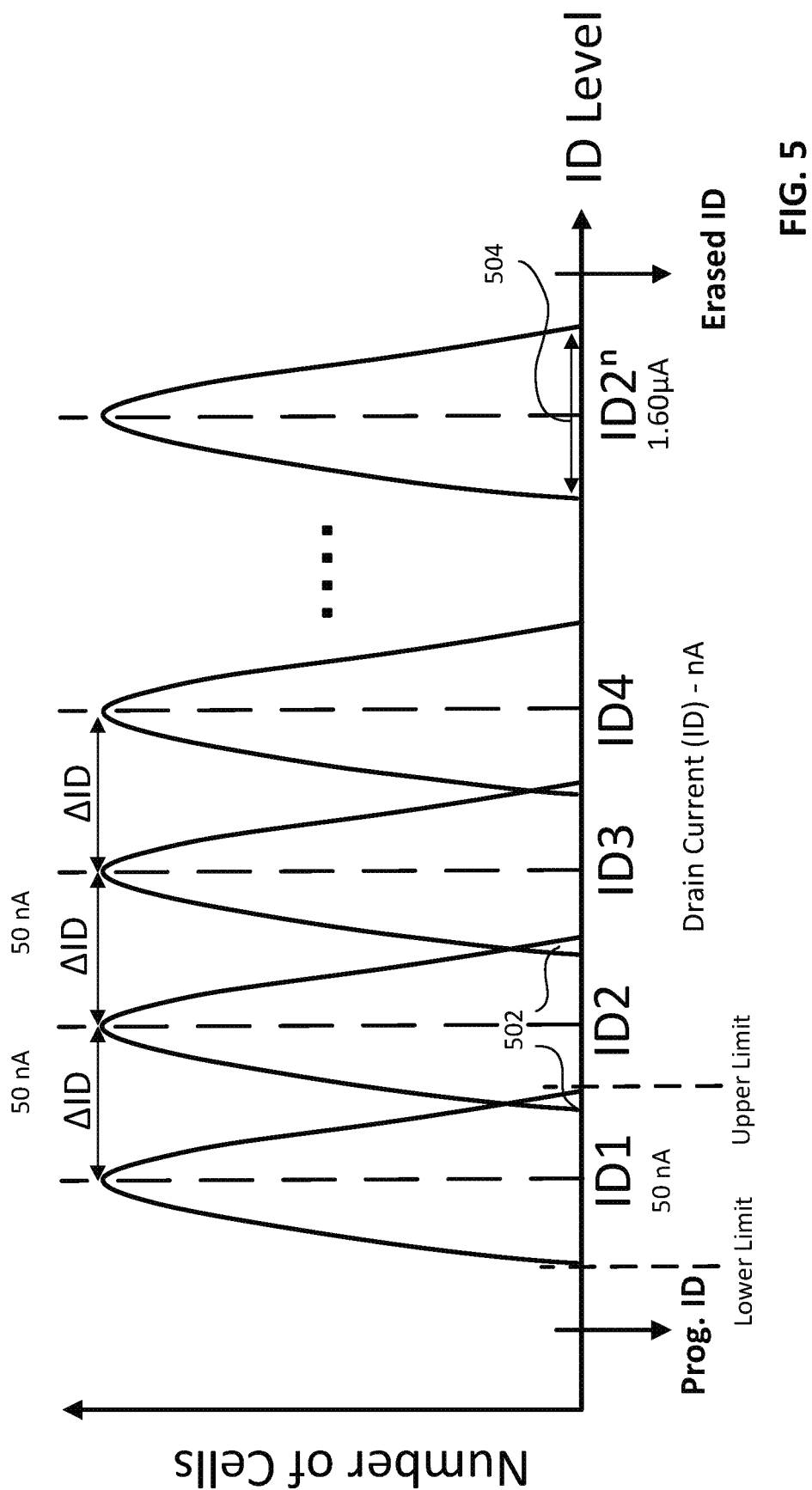
FIG. 5 is a representative graph illustrating distributions of drain current ($I_D$) levels in a multi-level SONOS based non-volatile memory cell according to an embodiment of the present disclosure.

FIG. 5 is a schematic graph showing multiple distinct drain current ($I_D$) levels of NVM memory cells in a SONOS based NVM analog device in accordance with one embodiment of the present disclosure. In one embodiment, $I_D$ of an NVM cell may be determined or verified by applying a predetermined voltage to CG of SONOS transistor via WLSs, and read via BLs. In other embodiments, $I_D$ may be determined by other methods known and practiced in the art. Similar to $V_T$, $I_D$ may be used to determine the binary state of NVM cells 90 in embodiments that NVM array 100 is utilized as a digital memory device, such as NOR Flash, EEPROM, etc. In other embodiments, NVM array 100 may be utilized in analog devices by storing one of multiple (more than two) analog values. Referring to FIGS. 4 and 5, instead of writing one of the two binary values ("0" and "1") to NVM cells 90 of NVM array 100 using hard program and erase operations as described in FIGS. 3A and 3B, NVM cells 90 may be written to multiple (more than two) $I_D$ or $V_T$ levels (corresponding to trapped charges in charge trapping layer 92) using a series of partial program and partial erase operations. In embodiments, by manipulating voltage difference or bias impressed upon the CG and drain or substrate, and pulse duration, partial program and erase operations may cause $V_T/I_D$ of target NVM cells to move towards (or a nudge) the Programmed $V_T/I_D$ and the Erased $V_T/I_D$ levels, respectively. Partial program and erase operations may include but not limited to soft program, refill program, soft erase (row), selective soft erase (cell), and anneal erase (row) operations, which will be further explained hereinafter.

In one embodiment, as best shown in FIG. 5, in an analog configuration/mode, NVM cells 90 may be configured to represent or store one of the $2^n$ (4, 8, 16, . . . ,128, etc.) values, wherein n is a natural number greater than 1, according to its $I_D$ level. In another embodiment, NVM cells 90 may be configured to represent one of any number of values that is greater than two. In one embodiment, $I_D1$ to $I_D2^n$ are the mean $I_D$ values of the $1^{st}$ to $2^{nth}$ $I_D$ distributions, respectively. In each $I_D$ distribution, there may be a lower $I_D$ limit and an upper $I_D$ limit (see $I_D1$). $1^{st}$ $I_D$ distribution may be similar to the programmed cells distribution σ3 and $2^{nth}$ $I_D$ distribution to the erased cells distribution σ4 in FIG. 4. In embodiments, mean $I_D$ or mean $V_T$ levels and their upper and lower limits may be predetermined according to system design and requirements. In one embodiment, operational $I_D$ range of NVM array 100 may be approximately ($I_D2^n$-$I_D1$), and as an example (1.60 μA−50 nA=1,550 nA). It will be the understanding that the $I_D$ range of 1,550 nA is merely an example and could be any other value depending on the NVM cells, operating voltages and pulse durations, and system requirements/design. In one embodiment, by writing NVM cells 90 to a particular $I_D$ level within the operational $I_D$ range, e.g. 1.60 μA to 50 nA, NVM array 100 may be utilized as an analog memory device. In one embodiment, one having ordinary skill in the art would understand that the same concept may apply to writing multiple (more than two) $V_T$ levels to NVM cells 90.

In one embodiment, to achieve multiple distinct $I_D$ levels within a finite operational $I_D$ range, each $I_D$ distribution may be required to have a tight distribution (low sigma σ) such that adjacent $I_D$ distributions are clearly separated, especially when n is a high number. $I_D$ of different levels may also be linearly incremental, such that $\Delta I_D$ is approximately constant in FIG. 5, for accurate and efficient read/verification operations. SONOS based cells, such as NVM cells 90, are a good candidate for analog memory with multiple levels due to its intrinsically low $I_D/V_T$ sigma and low power consumption ($V_{CC}$=0.81 V−1.21 V). Additionally, since both program and erase operations (both hard and soft) in SONOS based cells are done using FN tunneling, tuning of very fine $I_D/V_T$ levels with very low sigma may be achievable. Moreover, SONOS based cells may have high robust endurance performance with minimal degradation after 100K cycles from −40° C. to 125° C. temperature range, which may meet most of consumer, industrial, and automotive application needs. In one embodiment, there may be overlapping $I_D$ values 502 between adjacent $I_D$ distributions. To have a reliable and accurate read of the $I_D$ level of NVM cells 90, $I_D$ distribution sigma σ may be reduced to approximately below 8 nA or other current values such that the overlapping area 502 is kept below 1%-3% of the distributions. Depending on the spacing between the $I_D$ levels, the sigma may be higher or lower. In some cases, a sigma of 50 nA may be sufficient to keep the overlapping area below 1%-3% of the distributions.

Figure 6:
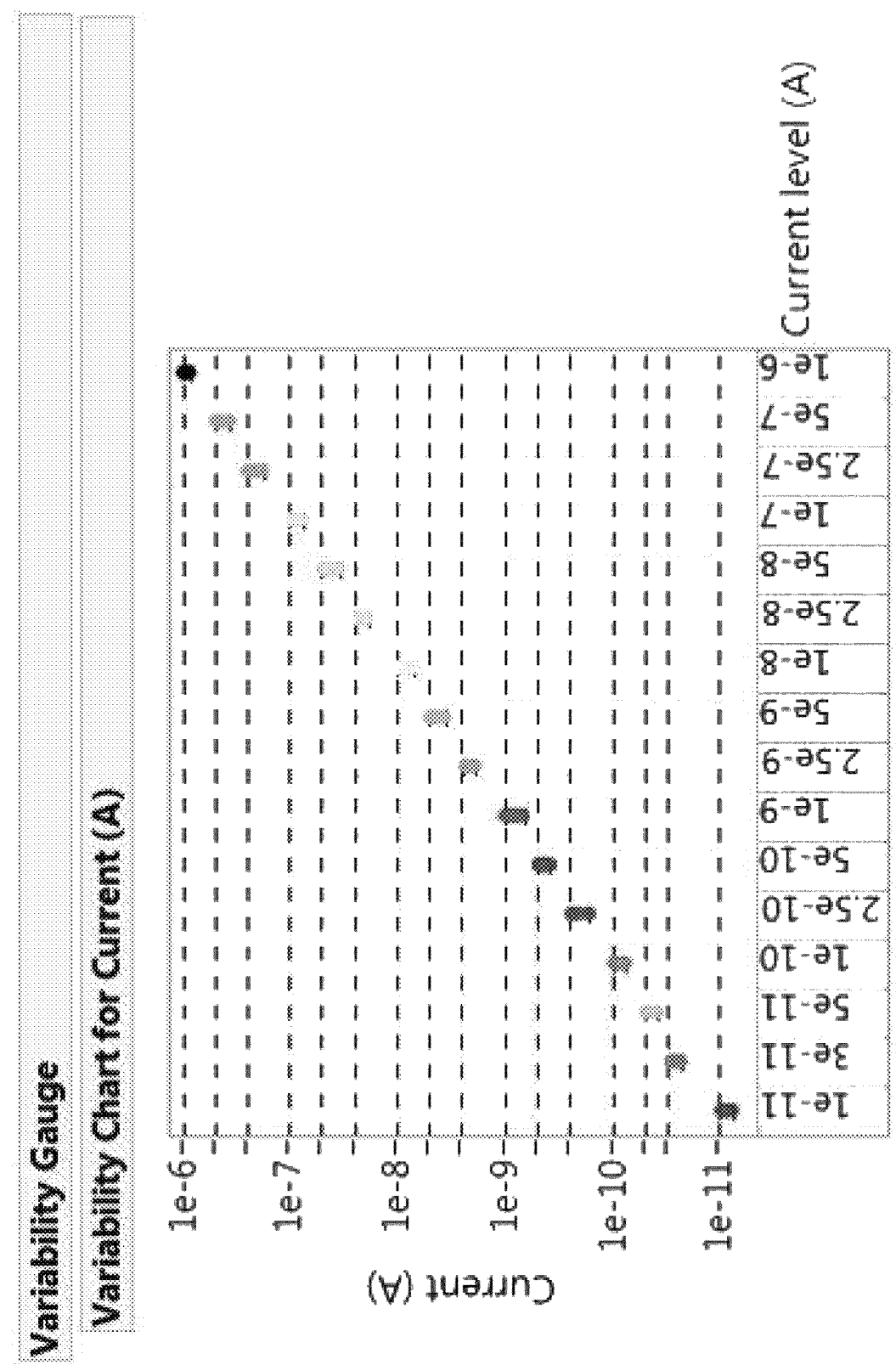
FIG. 6 is a graph illustrating distinct $I_D$ levels of a SONOS based memory transistor in a non-volatile memory array according to an embodiment of the present disclosure.

FIG. 6 is a graph illustrating 16 ($2^4$) $I_D$ levels of an NVM cell in accordance with one embodiment the present disclosure. As best shown in FIG. 6, $I_D$ levels are distinct, well separated (low sigma) and incrementally linear in order to maintain high functionality of multi-level NVM cells as an analog device.

As previously explained, a conventional write sequence, such as a hard erase and a hard program sequence, may not be precise enough to write one particular $I_D/V_T$ level out of multiple (more than two) levels to NVM cells. In one embodiment, it may take a sequence of hard program, hard erase, partial program and partial erase operations to write a precise $I_D/V_T$ level to an NVM cell, such as NVM cell 90.

Figure 7A:
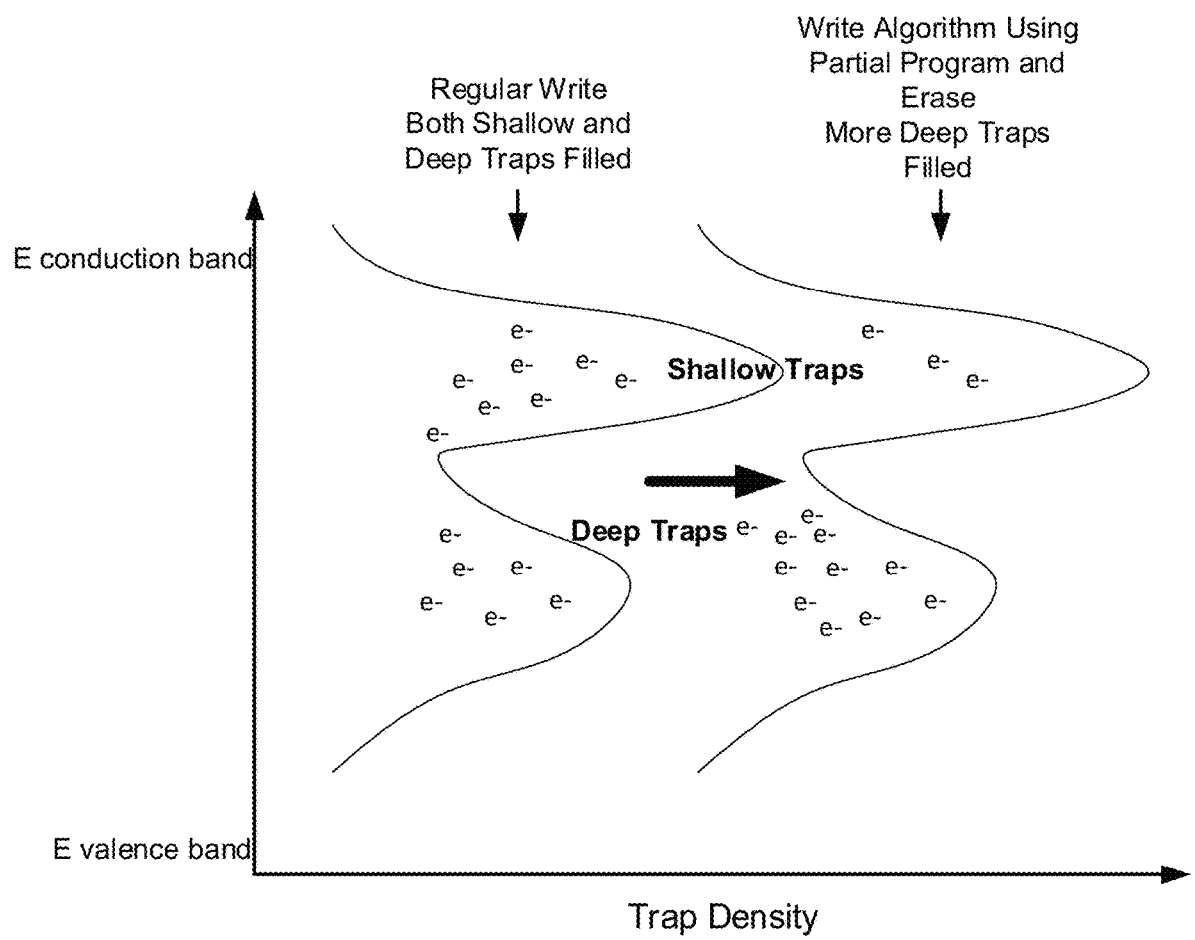
FIG. 7A is a graph illustrating distribution of trapped charges in the charge trapping layer of a SONOS based memory transistor in a non-volatile memory array according to an embodiment of the present disclosure.
Figure 7B:
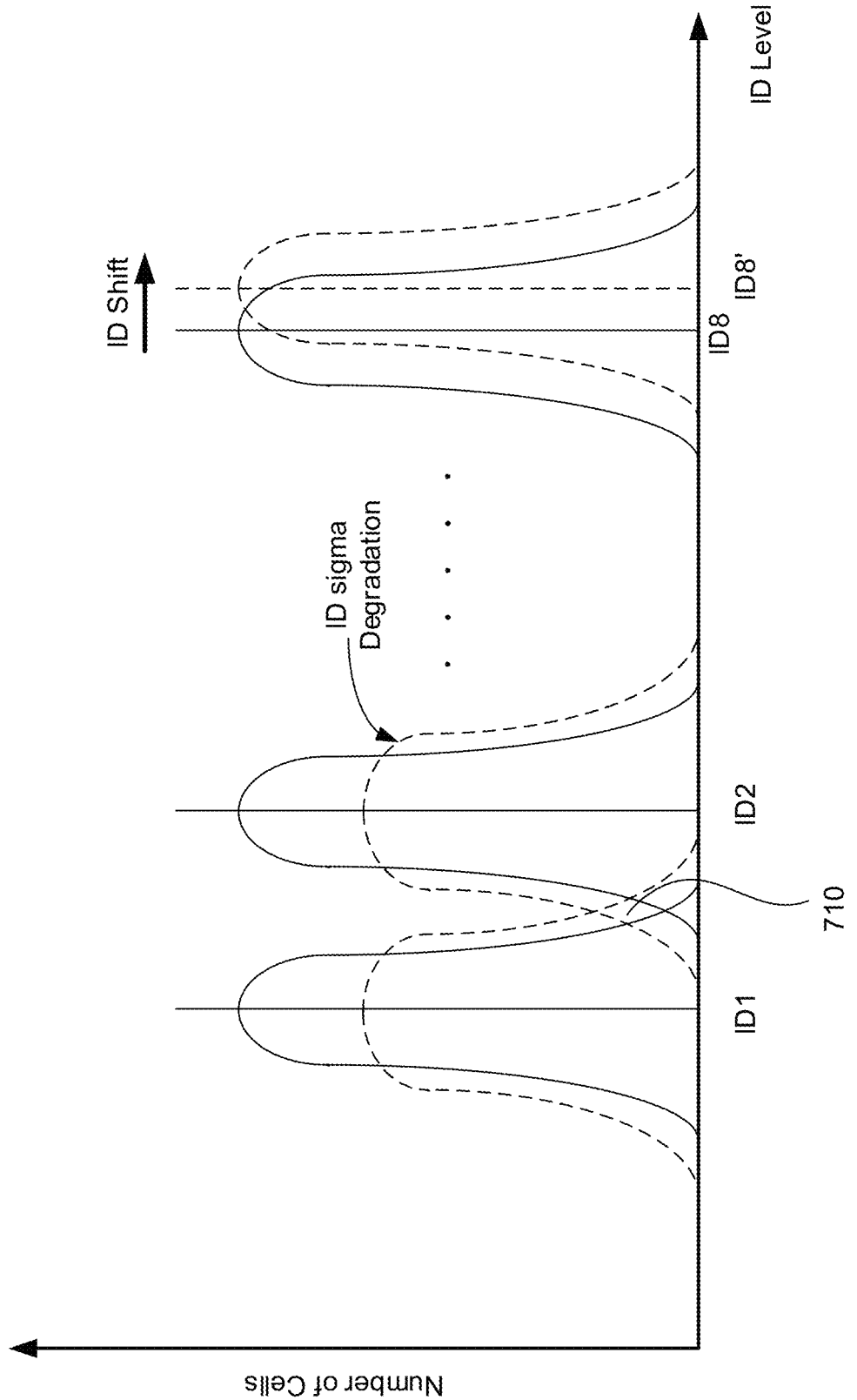
FIG. 7B a graph illustrating $I_D$ distributions of SONOS based memory transistors in a non-volatile memory array showing $I_D$ sigma and retention degradation according to an embodiment of the present disclosure.

FIG. 7A is a schematic diagram illustrating trap density distribution from valence band to conduction band in the charge trapping nitride layer of a SONOS transistor in accordance with the present disclosure. FIG. 7B is a graph illustrating potential effects on $I_D$ distributions in multi-level NVM cells due to $I_D$ and retention degradation. While the Beginning-of-Life (BOL) sigma of SONOS transistors 94 may be very low, there may be severe degradation during retention over time, especially at high temperatures. As a result, $I_D$ distributions (e.g. $I_D1$ and $I_D2$) may be more widely distributed (increased sigma) and adjacent $I_D$ distributions may have more overlapping portion 710 in FIG. 7B (e.g. more than 3%) that may lead to incorrect/false read of levels or values. In one embodiment, the sigma degradation may be due to the trapped charges in "shallow" traps in the nitride layer 92 being lost during retention while the trapped charge in "deep" traps remains trapped. The trapped charges loss during retention may also cause $I_D$ level to shift upwardly, such as $I_D8$ and $I_D8'$ in FIG. 7B. While the Beginning-of-Life (BOL) sigma of SONOS transistors 94 may be very low, there may be severe degradation during retention over time, especially at high temperatures. Referring to FIG. 7A, with conventional write algorithm using only hard erase and hard program operations, such as in NOR Flash or EEPROM, charges tend to be trapped in both shallow traps and deep traps. In one embodiment, more charge may be trapped in deep traps when using write algorithm using a series of partial erase/program operations, such as soft erase, soft program, selective soft erase, anneal erase, and refill program operations to nudge $I_D/V_T$ of NVM cells to their respective targets, as described in FIGS. 9A, 9B, 11, and 12, and may help redistributing charges from shallow traps to deep traps. In one embodiment, the partial erase and program operations may empty the charges from shallow traps and fill deep traps instead. As a result, both $I_D/V_T$ sigma degradation and retention of NVM cells may be improved while the target $I_D/V_T$ is maintained the same level.

Retention and $I_D/V_T$ sigma degradation may also be improved by fabrication process changes such that the density of shallow traps in the charge trapping layer is reduced. In one embodiment, fabrication process improvements may include smoothing of shallow trench isolation (STI) corner curvature in SONOS transistors, dopant profile optimization in channels, improved oxide layers, etc.

Soft Erase Operation:

In one embodiment, the operating voltages coupled to various nodes for a soft erase operation is similar to a hard erase operation as previously described in FIG. 3A. Therefore, a full erase voltage bias 8 V ($V_{NEG}$-$V_{POS}$) is still impressed between CGs and substrate/drain. In contrast to the hard erase operation, the WLS pulse (e.g. WLS0, WLS1) duration of a soft erase pulse is significantly shorter (Tse~20 μs), compared to Te~10 ms of a hard erase operation. Despite the same CG to drain voltage bias (e.g -8 V), the shorter soft erase pulse may only raise, e.g. from L4 to L2 in FIG. 10, but not move $I_D$ of NVM cells in the selected row 0 (e.g. C1, C2) to the Erased $I_D$ level. In one embodiment, a soft erase operation may only be performed on the entire selected row.

Anneal Erase Operation:

The general purpose of an anneal erase operation is to de-trap charges in shallow traps to improve the post-retention performance. Table III depicts exemplary bias voltages that may be used for an anneal erase operation of page/row 0 of a non-volatile memory having a 2T-architecture and including memory cells with N-type SONOS transistors and CSLs, resembling 2×2 array 300 as best shown in FIG. 3A.

TABLE III

| Node | Voltages (V) | Voltage Range (V) |
| --- | --- | --- |
| WLS0 | $V_{NEG}$ e.g. −3.8 V | −4.0 V to −2.0 V |
| BL0 | $V_{AEPOS}$ e.g. +2.2 V | +1.8 V to +2.4 V |
| WL0 | $V_{PWR}$ e.g. +1.1 V | +1.0 V to +1.2 V |
| SPW | $V_{AEPOS}$ e.g. +2.2 V | +1.8 V to +2.4 V |
| DNW | $V_{AEPOS}$ e.g. +2.2 V | +1.8 V to +2.4 V |
| CLS0 | $V_{AEPOS}$ e.g. +2.2 V | +1.8 V to +2.4 V |
| WLS1 | $V_{AEPOS}$ e.g. +2.2 V | +1.8 V to +2.4 V |
| BL1 | $V_{AEPOS}$ e.g. +2.2 V | +1.8 V to +2.4 V |
| WL1 | $V_{PWR}$ e.g. +1.1 V | +1.0 V to +1.2 V |

In one embodiment, unlike the erase and soft erase operations, a softer erase voltage bias ($V_{NEG}$-$V_{AEPOS}$) is impressed between CGs and substrate/drain as $V_{AEPOS}$ may have a lower magnitude than $V_{POS}$. The softer or lower erase voltage (e.g. 6 V vs. 8 V) is however applied to CGs for a much longer pulse duration, Tae~50 ms. In one embodiment, the longer and softer erase pulse may help remove charges in shallow traps that are closer to the conduction band. In one embodiment, an anneal erase operation may only be performed on the entire selected row.

Figure 8A:
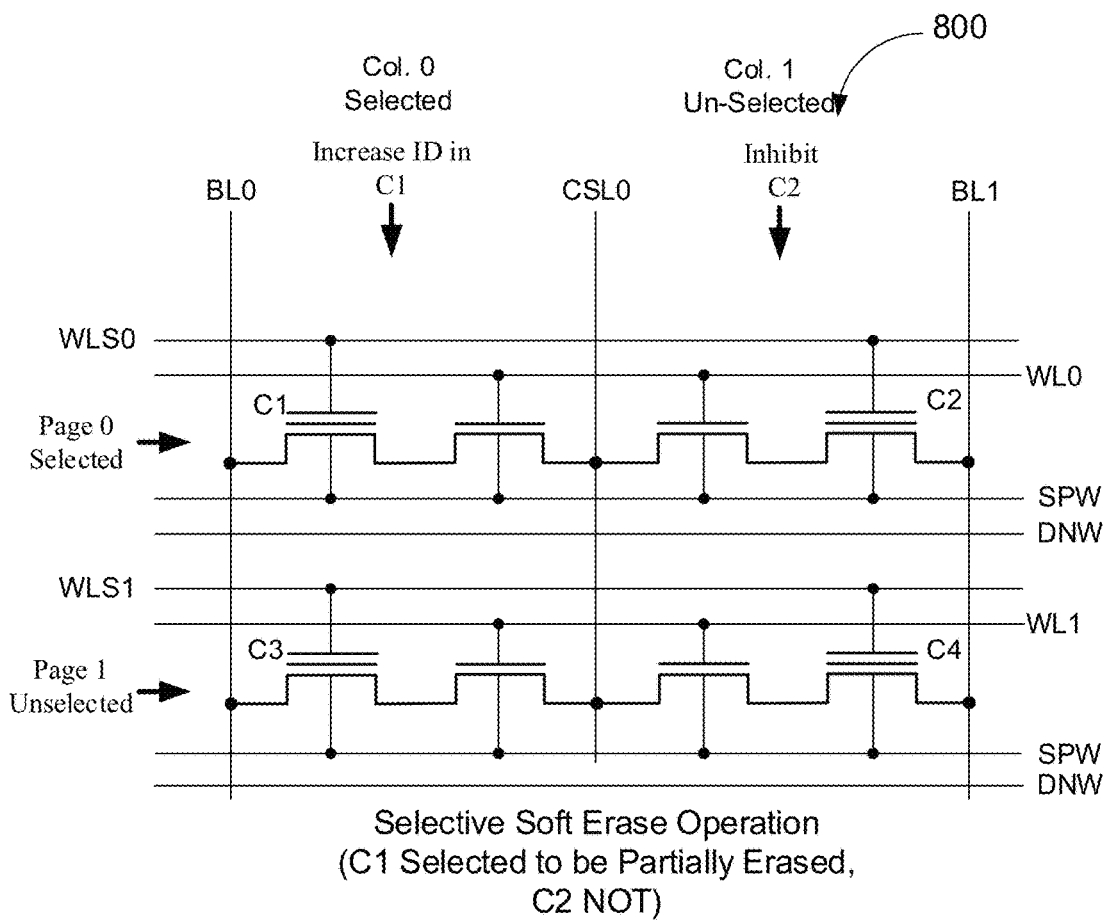
FIG. 8A is a schematic diagram of a segment of a SONOS based non-volatile memory array illustrating an embodiment of a selective soft erase operation according to the present disclosure.

Selective Soft Erase:

FIG. 8A illustrates a 2×2 array 800 of NVM array 100 to demonstrate an embodiment of a selective soft erase operation according to the present disclosure. In one embodiment, 2×2 array 800 may be similar to the 2×2 array 300 in FIGS. 3A and 3B. In the following description, for clarity and ease of explanation, it is assumed that all of the transistors in 2×2 array 800 are N-type transistors. It should be appreciated, without loss of generality that a P-type configuration can be described by reversing the polarity of the applied voltages, and that such a configuration is within the contemplated embodiments of the disclosure. In addition, the voltages used in the following description are selected for ease of explanation and represent only one exemplary embodiment of the subject matter. Other voltages may be employed in different embodiments.

Referring to FIG. 8A, 2×2 memory array 800 includes at least four memory cells C1, C2, C3, and C4 arranged in two rows and two columns. While NVM cells C1-C4 may be disposed in two adjacent columns (common source line CSL0), they may be disposed in two adjacent rows, or two non-adjacent rows. Each of the NVM cells C1-C4 may be structurally similar to NVM cell 90 as described above. Referring to FIGS. 3A, 3B, and 5, a hard erase operation as described in FIG. 3A may raise the $I_D$ of erased NVM cells to the Erased $I_D$ level in FIG. 5, and similarly a hard program operation to the Programmed $I_D$ level in FIG. 5. In one embodiment, Erased and Programmed $I_D$ levels may be distributed beyond the operational range of $I_D 1$ to $I_D 2^n$ of NVM array 100. In another embodiment, one of the Erased and Programmed $I_D$ levels may fall within the operational range.

Referring to FIG. 8A, for example, page 0 is selected to be partially erased/inhibited and page 1 is not (unselected) for a selective soft erase (SSE)/inhibit operation. In contrast to the hard, soft, and anneal erase operation embodiments explained previously, wherein a single page or row is the smallest erase block of NVM cells 90, a single NVM cell/bit or multiple NVM cells/bits in the same row (e.g. page 0) may be selected for a selective soft erase operation. The unselected NVM cells (e.g. C2) may be inhibited instead. Therefore, only selected NVM cell(s) including C1 in a selected row (page 0) has its $I_D$ level boosted (partially erased) by applying the appropriate voltages to a SONOS word line (WLS0) shared by all NVM cells in row 0, the substrate connections and to all bit lines in NVM array 100. In one embodiment, a selective soft erase (SSE) negative voltage $V_{SSENEG}$ is applied to WLS0, and an SSE positive voltage $V_{SSEPOS}$ is applied to BL0 and DNW of all NVM cells in page 0. In one embodiment, $V_{SSENEG}$ has a smaller absolute magnitude compared to $V_{NEG}$ used in the hard erase operation in FIG. 3A, and $V_{SSEPOS}$ has a greater absolute magnitude than $V_{POS}$ in FIG. 3A. $V_{EINHIB}$ is applied to WL0, SPW, BL1, and WL1 to inhibit the soft erase operation to unselected NVM cell, such as C2, from having its $I_D$ raised. CLS0 and WLS1 are either coupled to ground or 0 V. In one embodiment, SGs of all NVM cells C1 to C4 are at least partially turned off (WL=−1.4 V), which are usually turned on for a hard erase operation.

In one embodiment, despite the smaller absolute magnitude of $V_{SSENEG}$, a relatively full erase voltage bias ($V_{SSENEG}-V_{SSEPOS}=-7.2$ V) is still impressed between CG and BL0 of memory transistor in C1 only. The voltage difference between CG and BL1 in unselected C2 is only ($V_{SSENEG}-V_{EINHIB}=-0.9$ V). Therefore, $I_D$ of only the selected C1 may be raised but not the unselected C2 in the same selected row 0. In one embodiment, the pulse duration of selected erase operation ($T_{sse}\sim 20$ µs) coupled to WLS0 is much shorter than that in a hard erase operation (Te~10 ms). The shorter SSE pulse may not have enough time to erase all previously trapped charges (if any) in NVM cell C1. In one embodiment, all word lines including WL0 and WL1 and SPW are coupled to $V_{EINHIB}$ such that unselected NVM cells C2, C3, and C4 may not be partially erased as in NVM cell C1. In one embodiment, the general idea of a selected erase operation is to impress a relatively high erase voltage bias (e.g. 7.2 V) for a short period of time (20 µs) to reduce trapped charges in only the selected NVM cell(s) of the same row. In one embodiment, Tae>Te>Tsse and Tse. In one embodiment, more than one NVM cell in the same row (adjacent or not) may be selected for the SSE operation, while more than one NVM cell in the same row (adjacent or not) may be inhibited such that their $I_D$ level remain relatively unchanged.

Table IV depicts exemplary bias voltages that may be used for a selective soft erase operation of page/row 0 and column 0 (C1 only) of a non-volatile memory having a 2T-architecture and including memory cells with N-type SONOS transistors and CSLs, resembling 2×2 array 800.

TABLE IV

| Node | Voltages (V) | Voltage Range (V) |
|------|--------------|-------------------|
| WLS0 | $V_{SSENEG}$ e.g. −2.3 V | −2.5 V to −1.5 V |
| BL0 | $V_{SSEPOS}$ e.g. +4.9 V | +3.0 V to +5.0 V |
| WL0 | $V_{EINHIB}$ e.g. −1.4 V | −1.6 to −0.8 |
| SPW | $V_{EINHIB}$ e.g. −1.4 V | −1.6 to −0.8 |
| DNW | $V_{SSEPOS}$ e.g. +4.9 V | +3.0 V to +5.0 V |
| CLS0 | Ground or 0 V | Ground or 0 V |
| WLS1 | Ground or 0 V | Ground or 0 V |
| BL1 | $V_{EINHIB}$ e.g. −1.4 V | −1.6 to −0.8 |
| WL1 | $V_{EINHIB}$ e.g. −1.4 V | −1.6 to −0.8 |

Soft Program Operation:

In one embodiment, the operating voltages coupled to various nodes for a soft program (SP)/inhibit operation is similar to a hard program/inhibit operation as previously described in FIG. 3B, except for the voltage coupled to the selected WLS (e.g. WLS0). In one embodiment $V_{SPPOS}$ has a magnitude lower than $V_{POS}$ in the hard program operation such that the program voltage impressed on CG of selected C1 may be reduced. Therefore, a soft program voltage bias 6 V ($V_{NEG}-V_{SPPOS}$) is impressed between CGs and BL/substrate/P-wells. In contrast to the hard program operation, the WLS pulse (e.g. WLS0, WLS1) duration of a soft program pulse is significantly shorter (Tsp~10 µs), compared to Tp~5 ms of a hard program operation. With the smaller CG to drain voltage difference (e.g 6 V vs. 8 V) and the shorter soft program pulse (10 µs vs. 5 ms), the soft program operation may only reduce but not move $I_D$ of the selected NVM cell C1 to the Programmed $I_D$ level, e.g. from L3 to L2 in FIG. 10. In one embodiment, unselected NVM cells, e.g. C2 on the same row and unselected row, e.g. C3 and C4 may be inhibited.

Figure 8B:
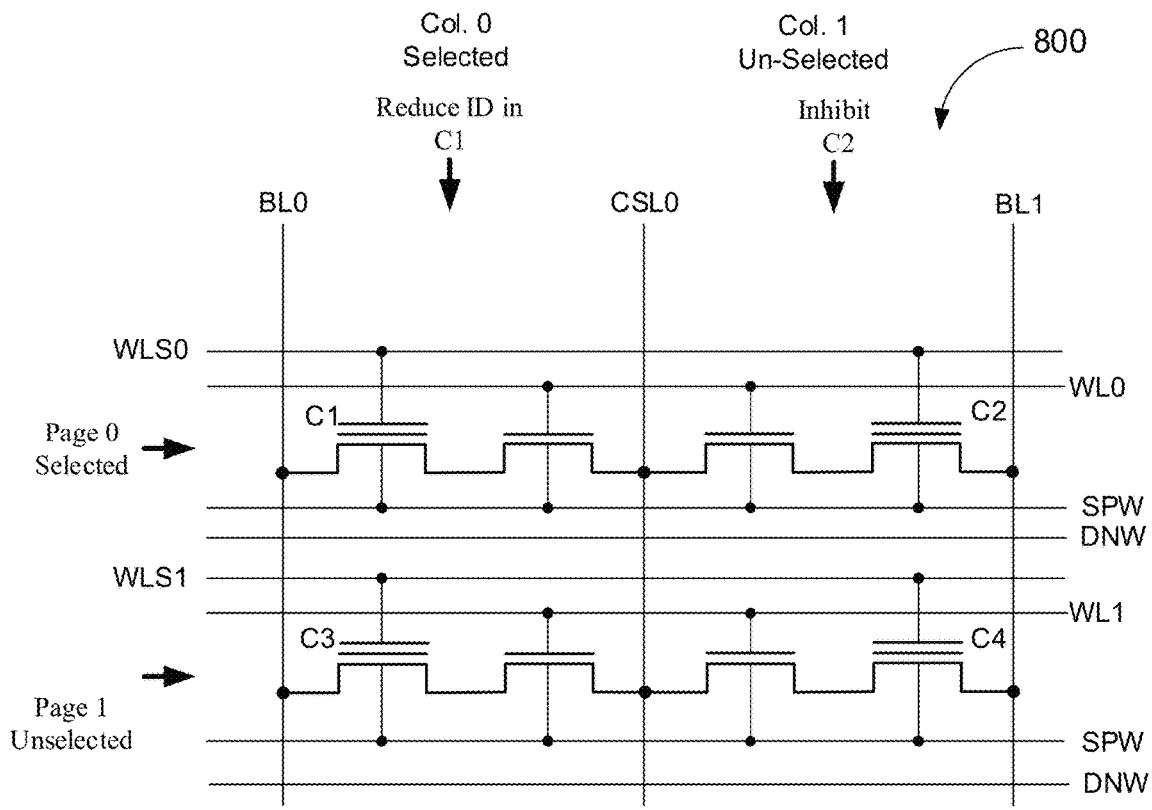
FIG. 8B is a schematic diagram of a segment of a SONOS based non-volatile memory array illustrating an embodiment of a refill program/inhibit operation according to the present disclosure.

Refill Program Operation:

FIG. 8B illustrates an exemplary embodiment of a segment 2×2 array 800 of NVM array 100, during a refill program(RP)/inhibit operation. Referring to FIG. 8B, for example, NVM cell C1 is the targeted cell to be partially programmed (reduce or move $I_D$ level towards the Programmed $I_D$ in FIG. 5) while NVM cell C2 is inhibited. It will be the understanding that C1 and C2, while being illustrated as two adjacent cells for illustrative purposes, may also be two separated NVM cells on the same row, such as row 0. The general purpose of a refill program operation is to fill charges in deep traps (see FIG. 7A) using a high program voltage bias to improve the post-retention performance. Table V depicts exemplary bias voltages that may be used for a refill program operation of page/row 0 of a non-volatile memory having a 2T-architecture and including memory cells with N-type SONOS transistors and CSLs, resembling 2×2 array 800 as best shown in FIG. 8B.

In one embodiment, unlike the soft program operations, a harder program voltage bias ($V_{RPPOS}-V_{RPNEG}$) is impressed between CGs and substrate/drain as $V_{RPPOS}$ may have a comparable but higher magnitude than $V_{POS}$ and $V_{RPNEG}$ may have a comparable but higher magnitude than $V_{NEG}$. The resulting program voltage bias impressed on CG of selected C1 is therefore comparable but slightly higher than that in the hard program operation as described in FIG. 3B (e.g. 9 V vs. 8 V). The harder program pulse is however only applied to the selected CG(s) for a very brief duration, Trp~5 µs. The short refill program pulse may reduce $I_D$ of C1 but not fully program it. In one embodiment, Tp>Tsp>Trp. The hard program pulse of the refill program operation may help fill charges in deep traps that have energy level between the conduction band and the valence band, as best shown in FIG. 7A. In one embodiment, similar to the hard program and soft program operations, unselected NVM cells C2, C3, C4, etc. may be inhibited. In one embodiment, the refill program operation may be performed after or before the anneal erase operation. The refill program operation may restore $I_D$ of selected NVM cells by re-filling charges in deep traps, which may be emptied out from shallow traps in the previous anneal erase operation.

Table V depicts exemplary bias voltages that may be used for refill programming NVM cell C1 in a non-volatile memory having a 2T-architecture and including memory cells with N-type SONOS transistors and CSLs.

TABLE V

| Node | Voltages (V) | Voltage Range (V) |
| --- | --- | --- |
| WLS0 | $V_{RPPOS}$ e.g. +5 V | +3.8 V to +5.0 V |
| BL0 | $V_{RPNEG}$ e.g. −4 V | −4.0 V to −3.4 V |
| WL0 | $V_{RPNEG}$ e.g. −4 V | −4.0 V to −3.4 V |
| SPW | $V_{RPNEG}$ e.g. −4 V | −4.0 V to −3.4 V |
| DNW | $V_{INHIB}$ e.g. +1.1 V | +1.0 V to +1.2 V |
| CLS0 | Float/$V_{MARG}$ e.g. −2.4 V | −3.0 V to −2.0 V |
| WLS1 | $V_{MARG}$ e.g. −2.4 V | −3.0 V to −2.0 V |
| BL1 | $V_{INHIB}$ e.g. +1.1 V | +1.0 V to +1.2 V |
| WL1 | $V_{RPNEG}$ e.g. −4 V | −4.0 V to −3.4 V |

It will be the understanding that the voltages and voltage ranges used in the above description on hard erase, hard program, partial erase, and partial program operations are selected for ease of explanation and represent only one exemplary embodiment of the subject matter, and should not be construed as limiting. Other voltages may be employed in different embodiments without loss the generality of the present disclosure.

Figure 9A:
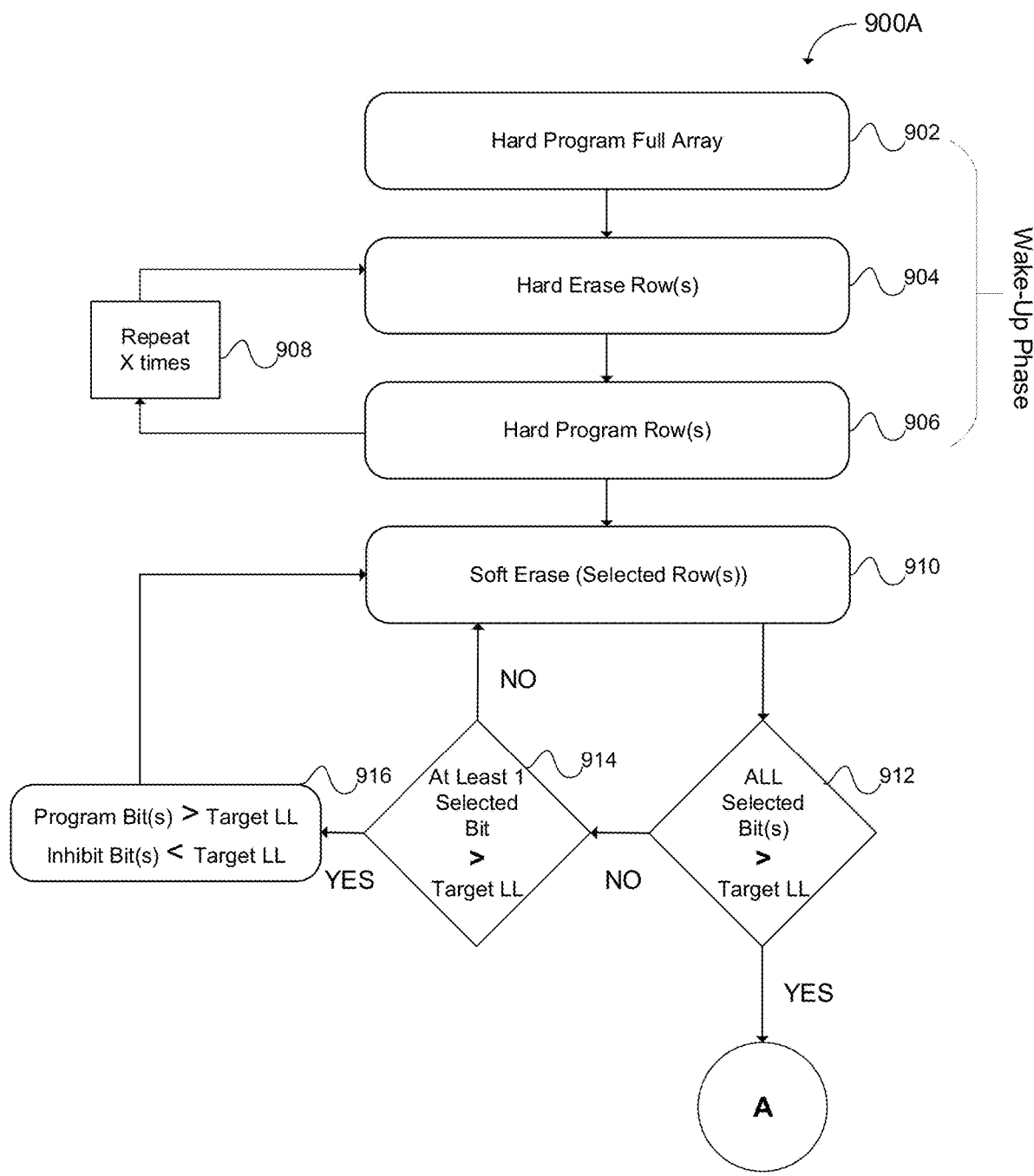
FIGS. 9A and 9B are schematic flowcharts illustrating an embodiment of a write operation for a multi-level SONOS based NVM array according to the present disclosure.
Figure 9B:
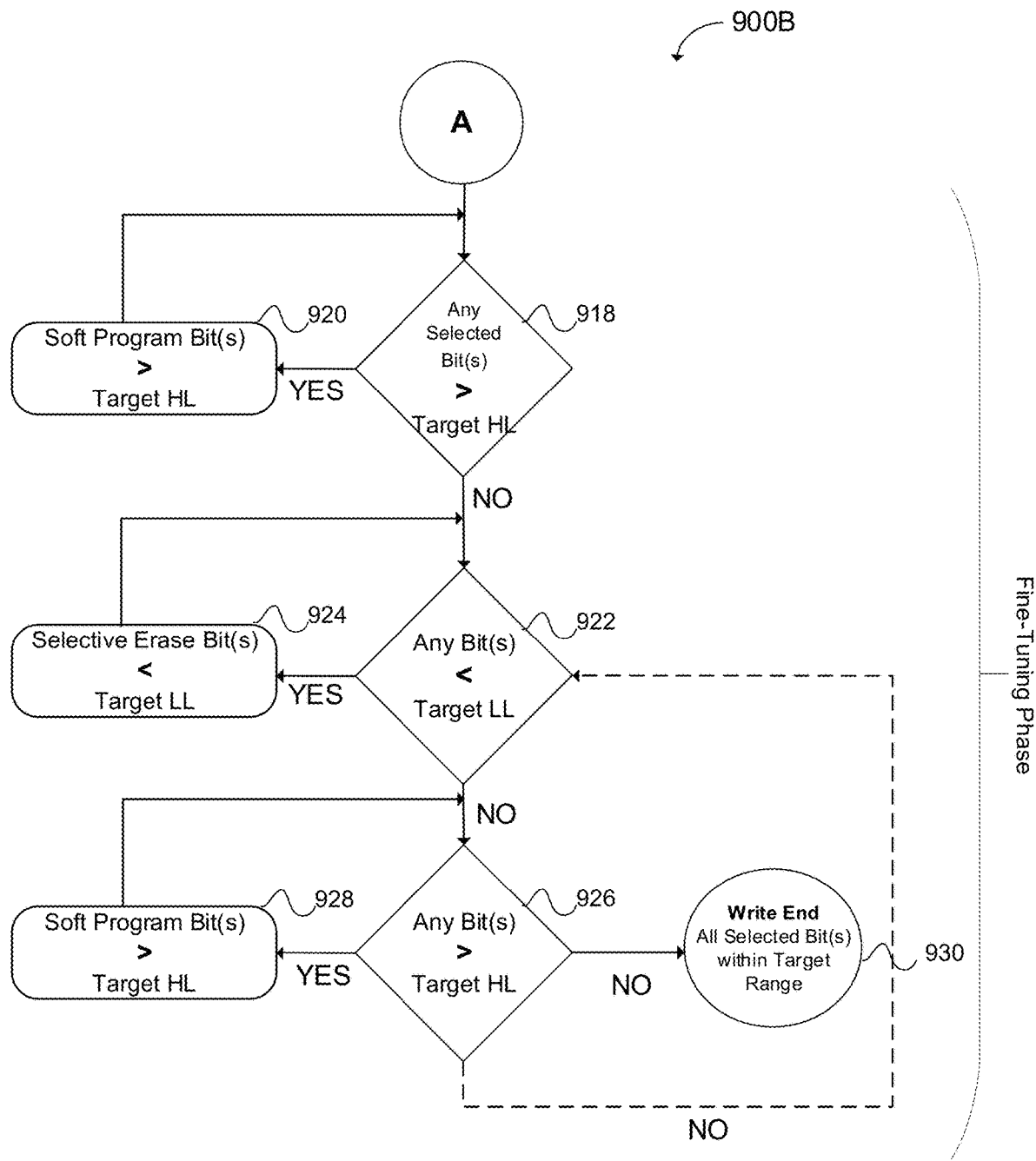
Figure 10:
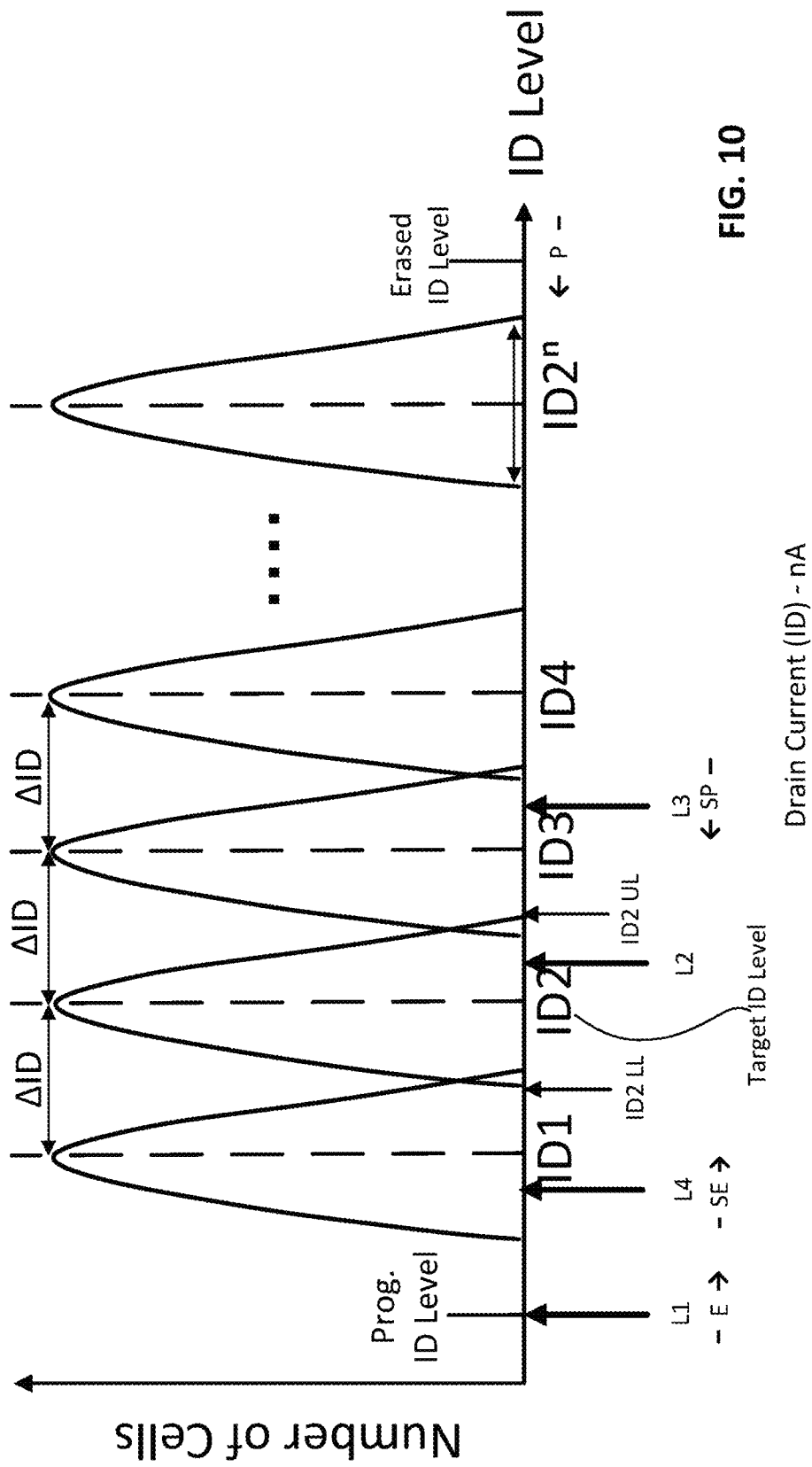
FIG. 10 is a graph illustrating level reduction/raise of distinct $I_D$ levels during a write operation of a SONOS based memory transistor in a non-volatile memory array according to an embodiment of the present disclosure.
Figure 13:
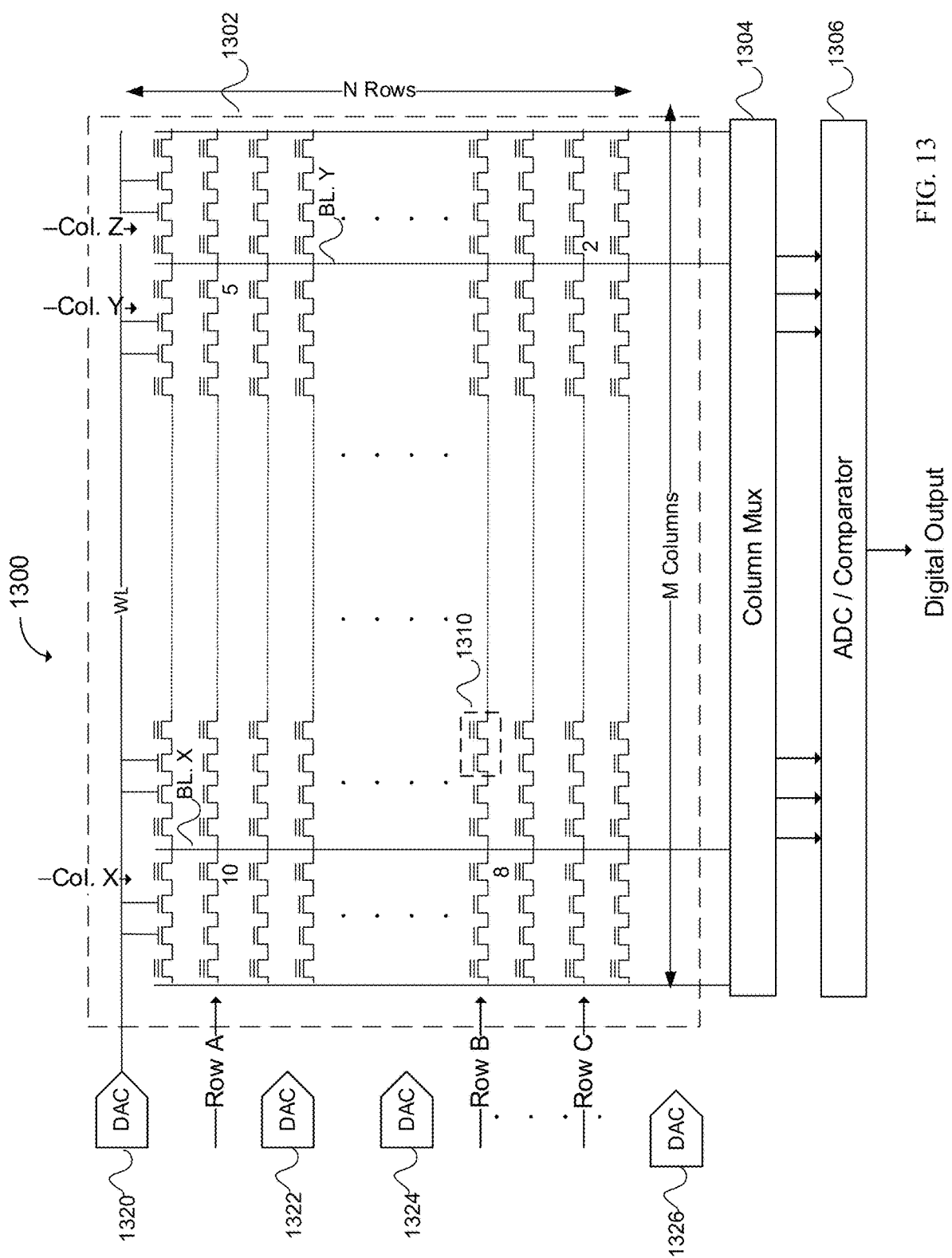
FIG. 13 is a schematic block diagram illustrating an embodiment of a multi-level SONOS based NVM device according to the present disclosure.

FIGS. 9A and 9B are representative flowcharts illustrating a method of write operation 900A and 900B of multi-level NVM cells in accordance with one embodiment of the present subject matter. FIG. 10 is a representative graph illustrating multiple $I_D$ or $V_T$ levels of an NVM cell in an analog NVM array in accordance with one embodiment of the present disclosure. As previously explained, the write method 900A and 900B may be applicable to tune both multiple $V_T$ and $I_D$ levels of NVM cells. It will be the understanding that, merely for the purpose of clarity and simplicity, method 900A and 900B may be explained from an $I_D$ perspective only hereinafter. Referring to FIGS. 9A and 9B, the main purpose of the write operation 900A and 900B is to precisely write a desired or predetermined $I_D$ or $V_T$ level (or target) to one or more selected cell or bit, such as SONOS based NVM cells 90 in NVM array 100 or multi-level or analog NVM array 1302 in FIG. 13, by a series of partial program, partial erase, and verification operations. In one embodiment, the written $I_D$ may have to fall within a relatively narrow $I_D$ distribution (low sigma) in order to maintain the functionality of an analog memory having multiple $I_D$ levels. Referring to FIGS. 9A and 13, the method 900A begins with a wake-up phase. In one embodiment, a hard program operation similar to the embodiment described in FIG. 3B may be performed in the entire analog NVM array 1302 to reduce leakage in unselected NVM cells, in step 902. It will be the understanding that a singular or multiple rows and columns of NVM cells may be selected for the write operation 900A and 900B. As an example, NVM cells in Row A and Col. X and Y in multi-level NVM array 1302 in FIG. 13 are selected for a write operation to attain a target $I_D2$ level, as shown in FIG. 10. Subsequently, a sequence of hard erase operations (FIG. 3A) and hard program operations (FIG. 3B) may be performed in the selected Row A, in steps 904 and 906 respectively. In one embodiment, $I_D$ of NVM cells in Row A may be moved firstly to the Erased $I_D$ level and then to the Programmed $I_D$ level, as illustrated in FIG. 10. Steps 904 and 906 may be repeated for X number of times, e.g. 5 times (in step 908), and the wake-up phase may get the selected Row A ready for the forthcoming operations. After the wake-up phase, NVM cells in the selected Row A may be at the fully programmed $I_D$ level (L1). In one embodiment, there may not be any verification or read operation during the wake-up phase.

Referring to FIGS. 9A and 10, a soft erase operation is performed on selected bits on Row A such that $I_D$ of those NVM cells is raised towards the Erased $I_D$ level from level L1, in step 910. Subsequently, unlike write operations of binary NVM cells, a verification operation that is similar to a regular read operation may be performed after every partial program and partial erase operation to check $I_D$ level of the selected bit(s). In step 912, a verification step is performed on the selected bits in Col. X and Y to check how much the soft erase operation in step 910 has raised their respective $I_D$. If $I_D$ of both bits in Col. X and Y are greater than the lower limit of the target $I_D$, i.e. $I_D2$ LL, the method may proceed to a fine-tuning phase, which is detailed in FIG. 9B. If $I_D$ of both bits are determined to be below $I_D2$LL in step 914, method 900A may go back to step 910 for another soft erase operation to further boost or raise both bits' $I_D$. If only one of the $I_D$ of the selected bits in Col. X and Y is determined to be below $I_D2$LL, a soft program operation may be performed on the bit that is above $I_D2$LL (to lower its $I_D$) while the bit that is below $I_D2$LL is inhibited such that both selected bits are on a similar $I_D$ level, in step 916. Then, method 900A may go back to step 910 for another soft erase operation to further boost both bits' $I_D$ towards the target $I_D$ level. In one embodiment, steps 912, 914, 916 may be repeated for several times until all selected bits (e.g. bits in Row A, Col. X and Y) have their $I_D$ level raised by the soft erase operation in step 910 and subsequently verified in step 912, to be greater than the target $I_D$ level's lower limit, such as L2 or L3 level in FIG. 10. In one embodiment, the aforementioned steps may be performed on all bits on selected Row A.

Referring to FIG. 9B, the write method 900B proceeds to the fine-tuning phase wherein a series of soft program and selective soft erase operations each followed by a verification operation are performed, on one or more selected bit to nudge each of their $I_D$ towards the target $I_D$ level (e.g. $I_D2$). In one embodiment, a verification or read operation may be performed on all selected bits to determine if any of the selected bits have $I_D$ exceeding the target $I_D$ upper limit (e.g. $I_D2$UL in FIG. 10). If both selected bits (e.g. Col. X and Y) are determined to be less than $I_D2$UL, the fine-tuning phase will proceed to step 922. If any of the selected bit(s)' $I_D$ is determined to be greater than $I_D2$UL (e.g. L3 level), a soft program operation (FIG. 8B) will be performed on those bit(s) to slightly lower its $I_D$ back within $I_D2$ distribution limits, in step 920. Other selected bits may be inhibited. In one embodiment, steps 918 and 920 may be repeated for several times until all selected bits are determined to have $I_D$ less than $I_D2$UL.

In verification step 922, all selected bits (e.g. Col. X and Y) will be read to determine if any of the bit(s)' $I_D$ has shifted below $I_D2$LL (e.g. L4 level) due to the previous soft program/inhibit operation(s) in step 920. If all selected bits are determined to be greater than $I_D2$LL, the fine-tuning phase may proceed to step 926. If any selected bit(s) is determined to have shifted below $I_D2LL$, a selective soft erase operation (FIG. 8A) may be performed only on those bit(s) to nudge their $I_D$ towards the $I_D2$ distribution. As discussed previously, unlike a hard or soft erase operation which may be performed on all bits in a row, a selective soft erase operation may be performed on only a singular bit or multiple bits in a selected row. In one embodiment, selected bits which do not undergo the selective erase operation may be inhibited ($I_D$ substantially unchanged). Steps 922 and 924 may be repeated for several times until all selected bits have their $I_D$ nudged above $I_D2LL$.

In verification step 926, all selected bits (e.g. Col. X and Y) will be read to determine if any of the bit(s)' $I_D$ has shifted above $I_D2UL$ due to the previous selective soft erase/inhibit operation(s) in step 924 (overcorrection). If any selected bit(s) is determined to have shifted above $I_D2UL$, a soft program operation (FIG. 8B) may be performed only on those bit(s) to nudge their $I_D$ back to the $I_D2$ distribution. In one embodiment, selected bits which do not undergo the soft program operation may be inhibited.

In one embodiment, if all selected bits are determined to be less than $I_D2UL$ in verification step 926, the fine-tuning phase may be terminated in step 930. All selected bits (e.g. Row A, Col. X and Y) are determined to have the target $I_D$ that is above $I_D2LL$ and below $I_D2UL$. The write method 900A and 900B may proceed to another row(s), such as Row B for the same or a different target $I_D$ level. In one embodiment, the write operation may be repeated until the entire analog NVM array 1302 is programmed to the target $I_D$ levels.

In another embodiment, the fine-tuning phase may loop back to step 922 to check if any selected bit(s) are overcorrected by the soft program operation(s) in step 928. Steps 922 (verification), 924 (SE) and steps 926 (verification), 928 (SP) may be configurably repeated several times depending on system requirements before the fine-tuning phase proceeds to the write end step 930. The repeated verifications may have their advantages in some embodiments, especially in multi-level NVM array having high number of $I_D$ levels (adjacent target $I_D$ levels are closely distributed).

Figure 11:
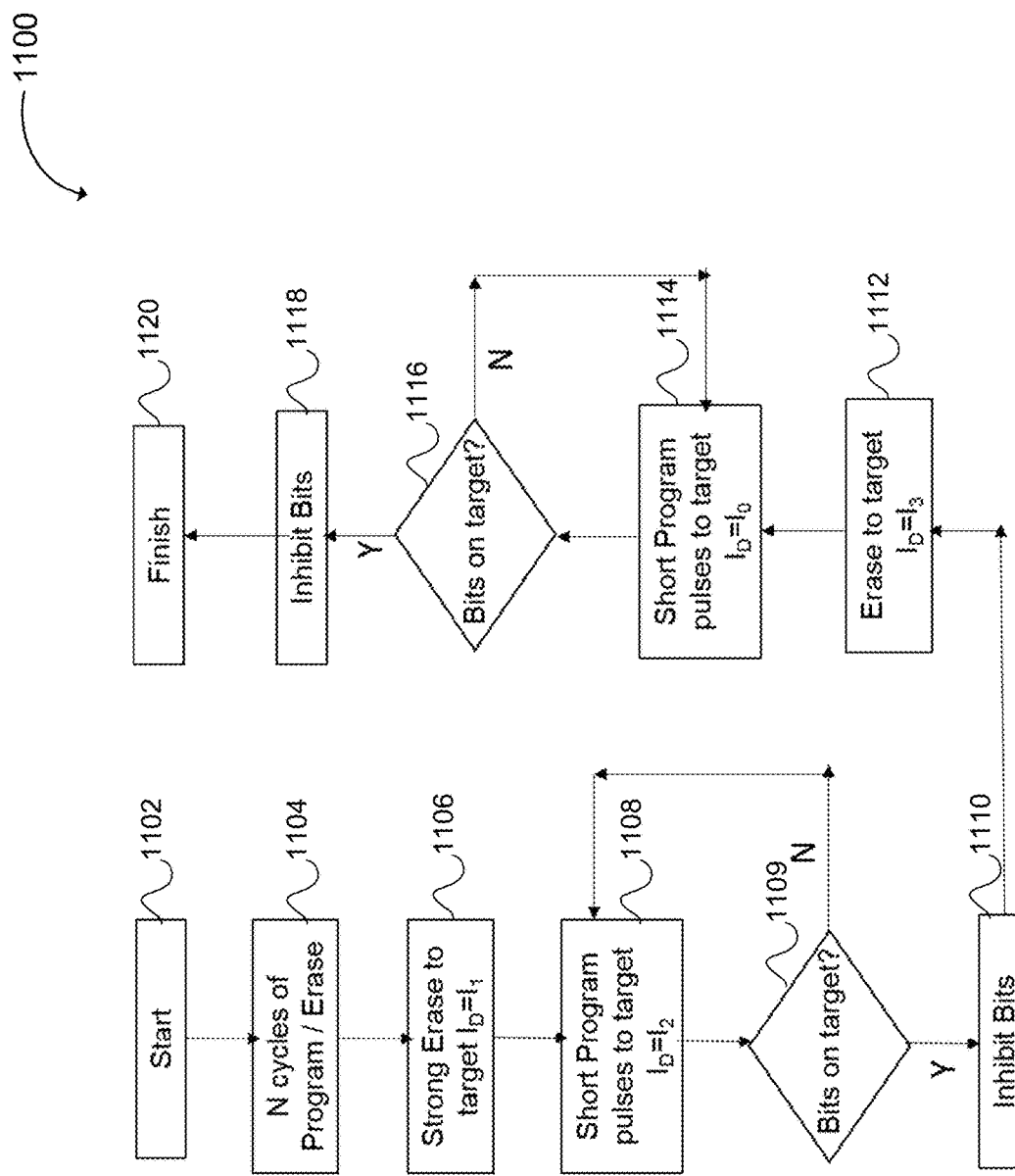
FIG. 11 is a schematic flowchart illustrating an embodiment of a write operation for a multi-level SONOS based NVM array according to the present disclosure.

FIG. 11 is a representative flowchart illustrating another embodiment of the write algorithm in accordance with the present disclosure. In one embodiment, the write algorithm 1100 may be adopted to write two bits from the same row (e.g. Row A, Col. X and Y in FIG. 13) to reach two different target $I_D$ (e.g. Col. X-$I_2$, Col. Y-$I_0$). Referring to FIG. 11, the method 1100 begins and multiple cycles of hard or strong program and erase operations (FIGS. 3A and 3B) may be performed to both Col. X and Y bits, in step 1104 (wake-up phase). Subsequently, a hard erase operation may be performed to both bits such that their $I_D$ level reaches $I_1$, in step 1106. In another embodiment, the hard erase operation may push $I_D$ of both bits beyond $I_1$ to the Erased $I_D$ level. Then, partial program operations such as the soft program operation (in step 1108) and verification or read (in step 1109) may be repeated several times until at least the Col. X bit reaches $I_2$ by comparing the Col. X bit to $I_2$ mean. Subsequently, Col. X bit may be inhibited for further program or erase operations since it has already reached its target $I_2$, in step 1110. Then, in step 1112, a selective erase operation may be performed on the bit that is not inhibited, i.e. Col. Y bit, to push its $I_D$ level to $I_3$. In one embodiment, several selective erase operations may be required for Col. Y bit to reach $I_3$. Then, partial program operations such as the soft program operation (in step 1114) and verification or read (in step 1116) may be repeated several times until Col. Y bit reaches its target level $I_0$. Once the Col. Y bit is determined to have reached its target $I_0$ by comparing Col. Y bit to $I_0$ mean, it may be inhibited like the Col. X bit for further program/erase operations, in step 1118. In one embodiment, $I_2 < I_0 < I_3 < I_1$ in this example. To determine whether a bit has reached its targeted $I_D$ level, it may compare the bit to the target $I_D$ mean level. In another embodiment, it may adopt the lower limit and upper limit algorithm that is detailed in FIGS. 9A and 9B in steps, such as steps 920, 924, and 926. In another embodiment, the write algorithm may proceed to write other bit(s) in the selected row or other row(s) using the same steps.

The write algorithm in FIG. 11 illustrates a basic concept of writing an analog value to an NVM array, such as multi-level NVM array 1302. In one alternative embodiment, more than one bit may be written to the target $I_2$ and $I_0$ as soft program and selective soft erase operations may be performed selectively on one or multiple bits in the same row. In other alternative embodiments, instead of using soft program operations (in steps 1106 and 1114) to nudge or fine-tune bits to their respective target $I_D$, selective soft erase operations may be employed additionally or alternatively. The example in FIG. 11 begins in the Erased $I_D$ level (after step 1106), it may also begin in the Programmed $I_D$ level when a hard program operation is performed instead (push all bits to $I_2$ or the Prog. $I_D$ level) in step 1106.

As previously explained, SONOS based cells, such as NVM cells 90 are suitable for multi-level analog memory devices due to its high endurance of 1K cycles and low power consumption. SONOS based NVM array may also have the advantage of low random telegraph noise (RTN) of below 3 nA. In one embodiment, retention specification for multi-level NVM devices may be more stringent than those in binary NVM devices, such as NOR Flash, EEPROM, etc., because of the close spacing of more than two adjacent $V_T/I_D$ levels that may represent more than two analog values. It may be imperative to improve data retention performance and $V_T/I_D$ sigma degradation to avoid incorrect or false reading of the multiple levels in multi-level NVM cells. One of the main contribution factors that adversely affect retention and $V_T/I_D$ sigma is losing charges during retention, such as electrons and holes, from shallow traps in charge trapping layer 92 of SONOS transistor 94, as best shown in FIGS. 1 and 7A&B.

Figure 12:
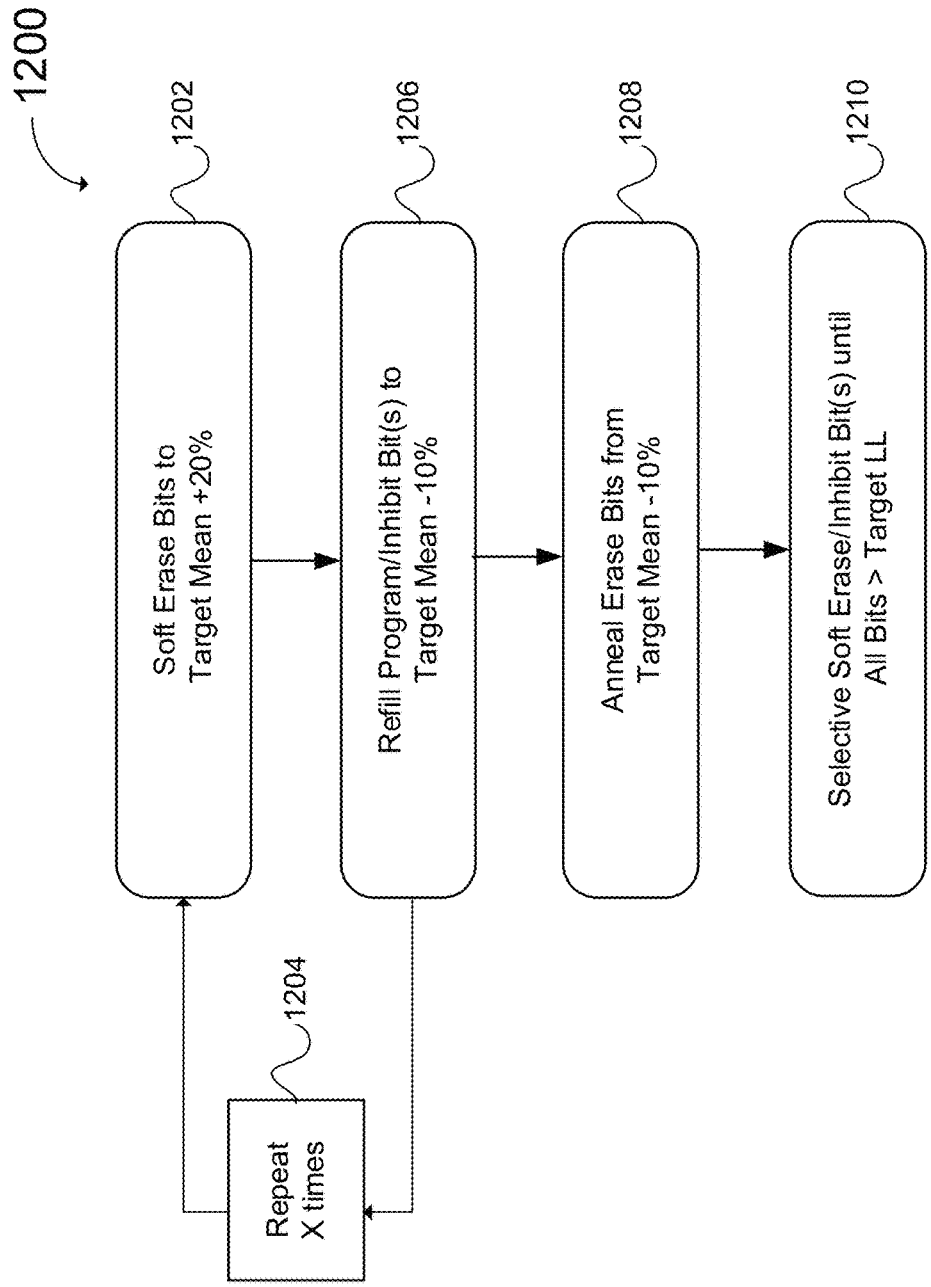
FIG. 12 is a schematic flowchart illustrating an embodiment of a refill/anneal operation for a multi-level SONOS based NVM array according to the present disclosure.

FIG. 12 is a representative flowchart illustrating a method of operating a refill and anneal routine algorithm in accordance with one embodiment of the present disclosure. Referring to FIG. 9B, writing of an analog value to a targeted multi-level NVM cell may be considered completed in step 930. In embodiments, the refill and anneal algorithm 1200 may be performed to one or more than one bit or an entire row of programmed bits. Using the same example as FIGS. 9A and 9B, bits in Row A, Col. X and Y may be written and store the targeted $I_D2$ value in step 930. In one embodiment, in order to improve the retention performance and minimize the $V_T/I_D$ sigma degradation, it may be beneficial to replace shallow trap charges (electrons or holes) by deep trap charges. In one embodiment, refill and anneal routine 1200 may be performed on bits that have been programmed to their target $I_D$ level(s). The method 1200 starts by performing a soft erase operation on selected bits (e.g. Row A, Col. X and Y) to raise their $I_D$ values to a target $I_D$ mean+X % level (e.g. $I_D2$+20 to 50%), in step 1202. A verification step may follow to ensure selected bits are at or exceed the target $I_D$ mean+20-50% level. In one embodiment, the soft erase operation may empty charges primarily in shallow traps to raise the $I_D$ value. Subsequently, a refill program operation, as previously described and best shown in FIG. 8B, may be performed on selected bits to reduce their $I_D$ values to a target $I_D$ mean −Y % level ($I_D2$−10 to 20%), in step 1206. A verification step may follow to ensure selected bits are at or below the target $I_D$ mean −10-20% level. In one embodiment, the short but strong refill program pulse (e.g. 9 V CG to drain) may replenish some of the removed charges in previous soft erase operation in step 1202 with charges stored primarily in deep traps. The steps 1202 and 1206 may be repeated for several number of times to accentuate the replacement of shallow trap charges by deep trap charges. It will be the understanding that $I_D2$−10 to 20% and $I_D2$+20 to 50% are examples adopted for explanatory purposes. Other offset percentages may be adopted as long as they swing the $I_D$ values of the selected bits from one to the other side of their target $I_D$ mean value.

The method 1200 may then proceed to perform an anneal erase operation, as previously described, on selected bits in step 1208. In one embodiment, the anneal erase operation may empty charges primarily in shallow traps to raise the $I_D$ value from $I_D2$−10% level, the result of step 1206. As previously explained, the soft (6 V CG to Drain) and long (~50 ms) anneal erase pulse may further allow enough time to empty out charges primarily in shallow traps. A verification step may follow to ensure at least one or more selected bits are at or above the target $I_D$ lower limit level (e.g. $I_D2LL$). Then, the method 1200 may proceed to perform selective soft erase operation on bit(s) that is below $I_D2LL$, in step 1210. Bit(s) that has its $I_D$ value above $I_D2LL$ due to the previous anneal erase operation (step 1208) may be inhibited instead. Verification operations may be performed to ensure all bits are partially erased to reach $I_D$ levels greater than $I_D2LL$. At the conclusion of step 1210, all selected bits (e.g. Row A, Col. X and Y) may be restored to the target $I_D$ level (e.g. $I_D2$) with most of the charges in deep traps due to the series of refill program and anneal erase operations.

In one alternative embodiment, steps 1202 (soft erase operation) and 1206 (refill program operation) of the refill and anneal routine 1200 may be performed, additionally or alternatively, right after step 918 (verified NO) in the write algorithm 900B in FIG. 9B.

FIG. 13 is a schematic block diagram illustrating an embodiment of a multi-level or analog NVM device 1300 in accordance with the present subject matter. In one embodiment, analog NVM array 1302 may be similar to NVM array 100 in FIG. 2, wherein multi-level NVM cells 1310 are arranged in N rows and M columns. Each multi-level NVM cell 1310 may have a 2T configurations (SONOS transistor and FET transistor) and share a CSL with one neighboring cell of the same row. In one embodiment, other connections such as WLSs, WLs, BLs, SPW, DNW, etc. may also resemble the configurations in NVM array 100 in FIGS. 1A, 1B, and 2. The multi-level NVM cell 1310 may be configured to have more than two distinct $I_D/V_T$ levels (see FIG. 10), e.g. $2^4$=16 or 0 to 15 levels. In one embodiment, each analog NVM cell 1310 may store an analog value of 0-15, corresponding to its $I_D/V_T$ level when read. In one embodiment, the multiple distinct $I_D/V_T$ levels and their corresponding analog values may be predetermined. The analog values may be written to the analog NVM cells 1310 using one or more write methods/algorithms as illustrated and described in FIGS. 9A to 12, using a series of partial program/inhibit operations, partial erase/inhibit operations, and verification steps. As an example, Row A, Col. X bit is written a 10 value ($I_D/V_T$ level=10), Row A. Col. Y bit a 5 value, Row B, Col. X bit an 8 value, and Row C, Col. Z a 2 value. In embodiments, multi-level NVM cells 1310 may be written to any analog value within the pre-defined $I_D/V_T$ level range (e.g. 0 to 15 for 16 $I_D/V_T$ levels). The aforementioned stored values may be used in examples of operation methods hereinafter for explanatory purposes only; and should not be construed as limitations.

In one embodiment, stored values of multiple multi-level NVM cells 1310 may be combined to store one analog value. For example, two multi-level NVM cells 1310 may be configured to having 8 levels, one cell may store 0-7 values and the other −8-−1 values. When the two cells are read in one operation, the combined cell may be considered having 16 levels (−8-7) representing 16 analog values instead of 8. In other embodiments, more than two multi-level NVM cells 1310 may be combined such that higher number of levels may be achieved without further dividing the operating $I_D/V_T$ range of multi-level NVM cells 1310. In embodiments, combined cells may be disposed on adjacent columns of the same row or adjacent rows of the same column, or scattered in analog NVM array 1302 according to some predetermined algorithms.

Referring to FIG. 13, analog NVM array 1302 may be coupled to column mux function 1304 via its bit lines (e.g. BL. X, Y). In one embodiment, column mux function 1304 may have multiplexors, capacitors, transistors, and other semiconductor devices. During a read operation, the 10 value of Row A, Col. X bit may be read out via BL. X to column mux function 1304, similar to a read operation of a digital NVM array. In one embodiment, multiple bits on the same column, such as Row A and B, Col. X may be selected in one read operation, such that the read out value is the sum of the two selected bits (10+8=18). In another embodiment, multiple bits on the same row, such as Row A, Col. X and Y may be selected for the same read operation. The column mux function 1304 may be configured to select both Col X and Y for reading and add up or subtract the two values (10+5=15 or 10−5=5). In another embodiment, NVM device 1300 may be configured to perform multiplication function. For example, the Row A, Col. X bit may be read 7 times in order to compute (7×10=70). Multiplication (M×stored values) may be performed by using M×multiple pulses on WL (coupled to SGs) or prolonging (by M times) pulse duration of one WL pulse. In one embodiment, as an example, the analog value "7" may be an input via digital-analog converter (DAC) 1320 from an external device, which may be coupled to a WL to a row of SGs. As best shown in FIG. 13, each DAC 1320-1326 may be coupled to one WL or multiple WLs. One of the functions of DAC 1320-1326 is to configure the selected row(s) for read operations. It will be the understanding that the number, configuration of DACs, and their coupling to NVM array 1302 shown in FIG. 13 is one of the examples for illustration purposes only. Other configurations may be possible, according to system requirements and design, without altering the general teaching of the present embodiment. In various embodiments, DACs 1320-1326, analog NVM array 1302 and column mux function 1304 may be configured to perform simple arithmetic functions, such as summation, multiplication, etc. as illustrated in previous examples, with or without a CPU or GPU. In one embodiment, analog NVM device 1300 may perform functions of both a data storage device and an inference device.

Analog results from column mux function 1304 may then be inputted to analog-digital convertor (ADC) or comparator 1306, wherein the analog read out result may be converted to digital data and outputted. In one embodiment, the entire or a portion of analog NVM array 1302 may be refreshed or having its analog value re-written on a regular basis, such as every 24 hours or 48 hours or other durations. The refresh operation may minimize potential effects of $I_D/V_T$ levels shift or decay of programmed multi-level NVM cells due to retention, $I_D/V_T$ degradation (best shown in FIG. 7B), or other causes. In another embodiment, analog NVM array 1302 may include reference cells (not shown), wherein the common effects of potential $I_D/V_T$ levels shift may be subtracted from multi-level NVM cells 1310.

Figure 14:
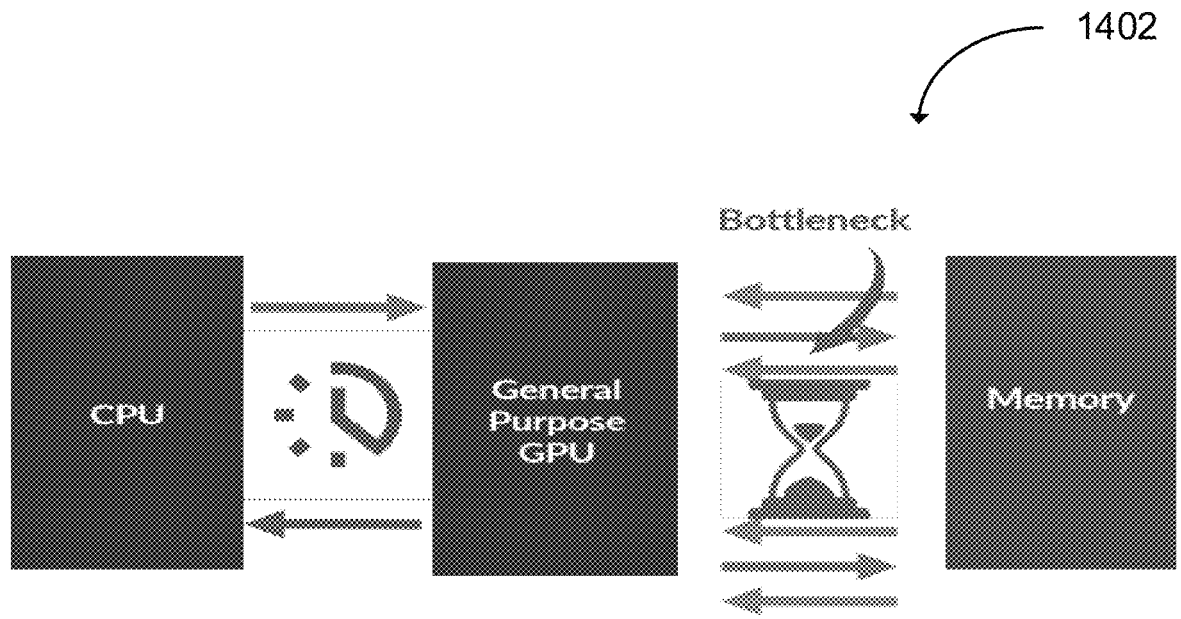
FIG. 14 is a representative block diagram illustrating an embodiment of a conventional digital multiply accumulate (MAC) system.
Figure 15:
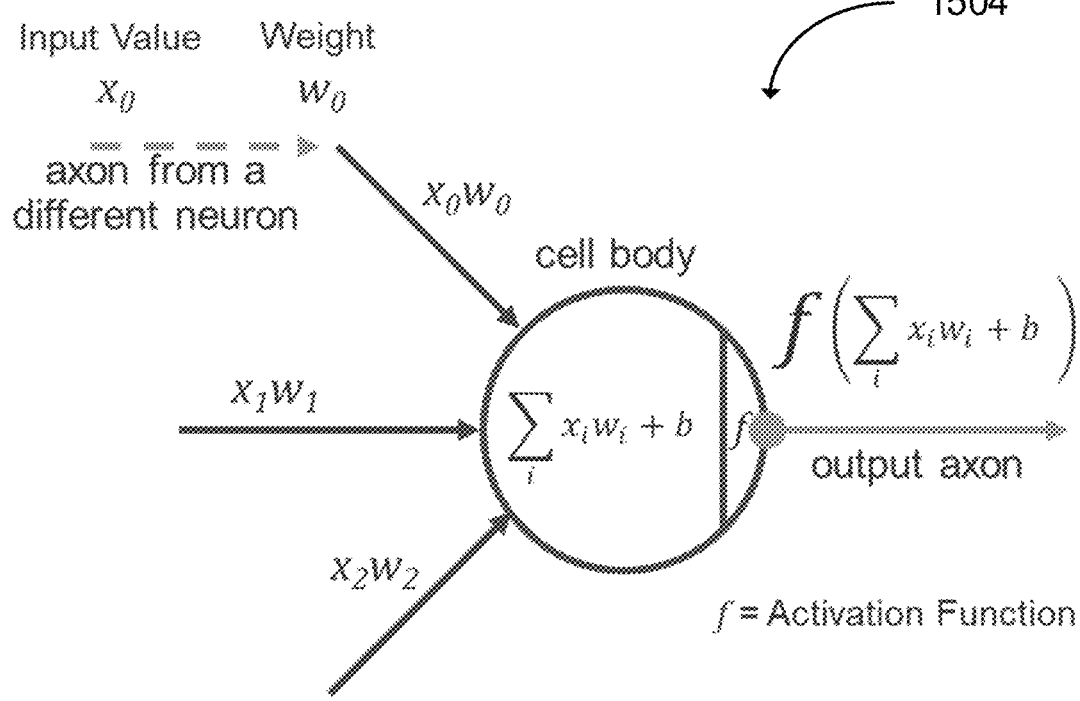
FIG. 15 is a representative diagram illustrating an embodiment of an artificial neuron of a deep neuron network (DNN) system.

FIGS. 14 and 15 are representative block diagrams respectively illustrating a Von-Neumann architecture of a multiply accumulate (MAC) system and an artificial neuron according to one embodiment of the present disclosure. Artificial Intelligence (AI) may be defined as the ability of a machine to perform cognitive functions executed by a human brain, such has reasoning, perception, and learning. Machine learning may use algorithms to find patterns in data and use a model that recognizes those patterns to make predictions on any new data or patterns. At the heart of AI applications or machine learning, there is the MAC or dot product operation, wherein it may take two numbers (input values and weight values), multiplies them together, and add the results to an accumulator. The artificial neuron 1504 in FIG. 15 may be a portion of a deep neural network (DNN) that features an example of a MAC operation. DNN mimics the functionalities of a human brain by implementing massively parallel computing (neuromorphic computing) architecture connecting low power computing elements (neurons) and adaptive memory elements (synapses). One reason for the rapid growth in machine learning is the availability of graphic processing units (GPUs). In a MAC application, such as system 1402, GPUs may perform necessary computations much faster than a general purpose CPU. One of the downsides of using GPUs for MAC operations is that GPUs tend to utilize floating-point arithmetic, which may be well beyond the needs of a relatively simple machine learning algorithms, like the MAC operations. Besides, AI applications, especially those run at the edge, may require MAC to run at high power efficiency to reduce power need and heat generation. The existing all digital Von-Nuemann architecture-based systems, like MAC system 1502, may also create major bottleneck issues between GPUs that do the computation and memory that only stores data (weight values, input values, output values, etc.) due to the frequent accesses of the memory. Therefore, there are needs to consider using low power consumption memory elements that may be configured to perform as an inference device, as well as a data storage device.

Figure 16:
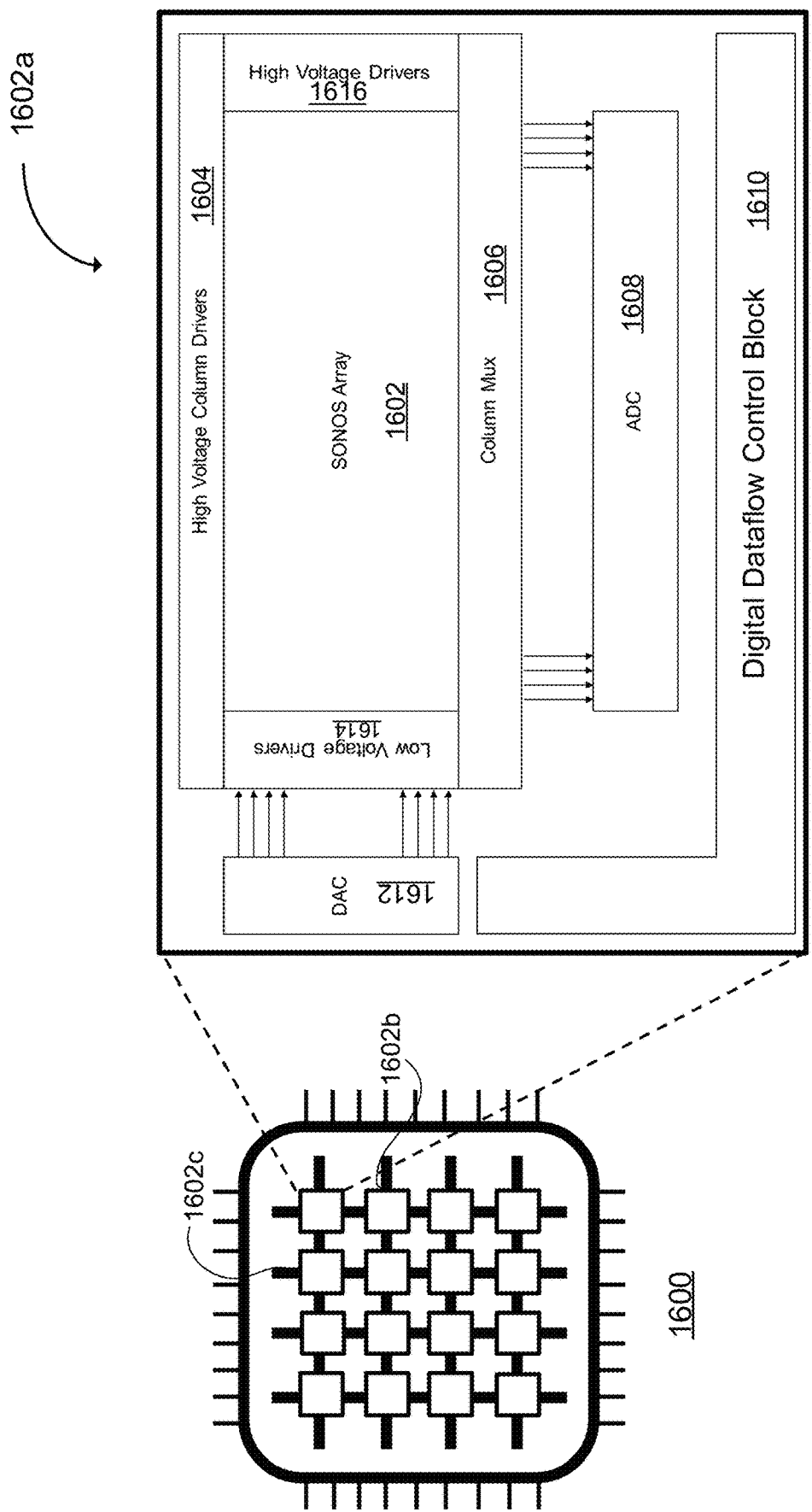
FIG. 16 is a schematic diagram illustrating an embodiment of an analog neuron network (NN) accelerator device according to the present disclosure.

FIG. 16 is a representative block diagram illustrating a neural network accelerator system in accordance with one embodiment of the present disclosure. In one embodiment, SONOS based analog devices may have the unique ability to store analog values of weights locally and process each non-volatile memory element in parallel, which may significantly eliminate massive data movement energy expenditure as illustrated in FIG. 14. Each NVM cell may have multiple levels (e.g. 4 bit-8 bit) instead of binary levels (1 bit), and each $I_D/V_T$ level may represent a multi-bit weight value (wi in FIG. 15) for making an inference. In one embodiment, the higher the number of levels, the higher the training accuracy and the lower the inference error rates. Key performance and reliability requirements for a typical analog memory for neuromorphic computing are sigma of cell $I_D/V_T$, retention, and noise at all levels. As previously explained, SONOS based NVM devices, such as analog NVM device 1300 in FIG. 13 may be a good candidate to perform both storage and inference functionality of an artificial neuron in a DNN system.

Referring to FIG. 16, neural network accelerator system 1600 may include multiple analog NVM devices or accelerators 1602 disposed in a single substrate or package or die, coupled to one another via a bus system. Each accelerator 1602 may resemble the analog NVM device 1300 in FIG. 13 and be operated similarly. In one embodiment, NVM device 1602 may be configured to perform MAC operations. Each analog NVM device 1602 may function as the artificial neuron 1504 in FIG. 15 in a DNN system. In one embodiment, SONOS array 1602 may have multiple SONOS based NVM cells (not shown in FIG. 16) arranged in rows and columns. In other embodiments, SONOS array 1602 may include multiple SONOS NVM sections or arrays. Each NVM cells may be configured to store a weight value of 0 to $2^n$-1 or other values that are written using the write algorithm as depicted and illustrated in FIGS. 9A to 12, and a combination thereof. In other embodiments, the analog value of each NVM cell may be written by other write algorithms.

As part of neuromorphic computing algorithm, each analog NVM device 1602, such as accelerator 1602a may perform the following MAC function, wherein xi are inputs from other analog NVM device(s) 1602 or external devices, wi is the stored weight values, b is a constant, and η is an activation function:

$$f(\Sigma_i xiwi+b) \quad (1)$$

As best shown in FIG. 16, xi may be digital inputs from other analog NVM devices, such as 1602b and 1602c or other analog NVM device(s). Digital inputs xi may then be converted to analog signals by DAC 1612, which may then be coupled to low voltage drivers 1614 and/or high voltage drivers 1616. In one embodiment, low voltage drivers may generate control signals via WLs (to control SGs) of NVM cells corresponding to the analog signals from DAC 1612. High voltage column drivers 1604 may generate control signals to BLs and high voltage drivers to WLSs to control CGs of NVM cells.

One embodiment of MAC operations in analog NVM device 1602a may be illustrated using the example in FIG. 13, wherein i may be set to 3. Referring to FIG. 13, digital inputs xi may be coupled to DAC 1320-1326 and x1=3, x2=5, x3=1. The selected weight values are stored in bits in Row A, Col. X (w1=10), Row B, Col. X (w2=8), and Row C, Col. Z (w3=2). The weight value selection may be based on the addresses received from other analog NVM devices 1602 or from external devices, such as processors, CPU, GPU, etc. The constant b may be selected to be the analog value stored in Row A, Col. Y (b=5). In order to compute x1×w1, Row A and Col. X (stored value=10) may be selected for a read. The read may be repeated for x1=3 times to compute x1×w1. Similarly, Row B, Col. X (weight value=8) may be selected for x2=5 reads to compute x2×w2 and Row C, Col. Z (weight value=2) for x3=1 read to compute x3×w3. Alternatively, Row A and B, Col. X may be both selected for read for 3 times (to accumulate combined weight values), and only Row A, Col. X may be selected for an extra 2 reads. Then the bit at Row A, Col. Y (b=5) may be selected for a read. As previously explained, column mux 1304 or 1606 may be configured to add those results together in order to compute the MAC result as 3×10+5×8+1×2+2=74. It will be the understanding that the above algorithm is only one example of using SONOS based NVM devices, such as an inference NVM device 1300 and 1602 to compute MAC results for explanatory purposes and should not be construed as limitations. MAC weight values (wi) may be stored, organized, and read in multiple ways to compute MAC results according to system design and requirements. In one embodiment, activation function (f) may be an algorithm to indicate or prioritize MAC outputs of analog NVM devices 1602 from the perspective of the entire neural network. For example, the MAC result of the previous example (result=74) may be considered not important and assigned a low priority. The output signal may be reduced or boosted according to its priority and the execution may be carried out in column mux function 1606 or ADC 1608 in some embodiments.

Subsequently, in one embodiment, the MAC result in the form of an analog signal may be converted to a digital signal by ADC 1306 or 1608. The digital signal may then be outputted to another or other analog NVM device(s) 1602 as xi for their own MAC operations. In one embodiment, similar to a DNN, neuromorphic computing performed by all analog NVM devices 1602 may be performed in parallel. The digital MAC outputs of each analog NVM device 1602 may be transmitted to other analog NVM devices as digital inputs. In some embodiments, the plurality of analog NVM devices 1602 may be divided into multiple subsets. The digital outputs of one subset of analog NVM devices 1602 may be propagated to the next one without repeating. The digital output of the last subset may be outputted as the neuromorphic computing or machine learning results to external devices.

In one embodiment, command and control circuitry (not shown in FIG. 16) including digital dataflow control block 1610, may be programmable and configured to direct data flow traffic within analog NVM devices 1602. The command and control circuitry may also provide control over low and high voltage drivers 1614 and 1616 and high voltage column driver 1604 to provide various operation voltage signals to SONOS array 1602 via SONOS word lines, word lines, bit lines, CSL, etc., including and not limited to $V_{POS}$, $V_{SEPOS}$, $V_{RPPOS}$, $V_{NEG}$, $V_{SENEG}$, $V_{CSL}$, $V_{MARG}$, $V_{INHIB}$, etc. as depicted in at least FIGS. 3A, 3B, 8A, 8B.

It will be appreciated by those skilled in the art that neural network accelerator system 1600 and analog NVM devices 1602 in FIG. 16 have been simplified for the purpose of illustration, and not intended to be a complete description. In particular, analog NVM devices 1602 may include processing function(s), row decoder, column decoder, sense amplifiers or other comparators, and command and control circuitry that are not shown or described in detail herein.

Figure 17:
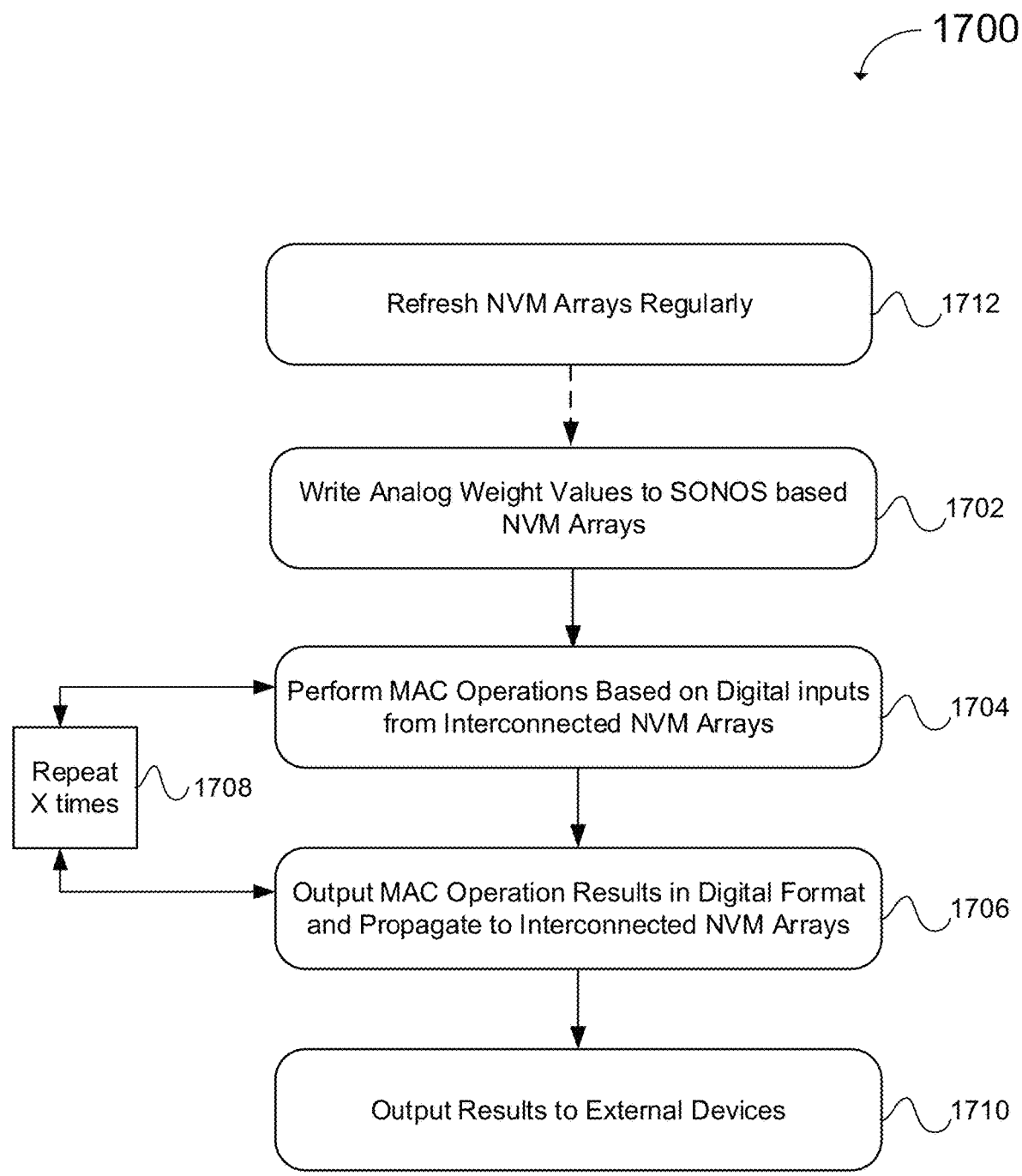
FIG. 17 is a schematic flowchart illustrating an embodiment of the method of operation of the NN accelerator device in FIG. 16.

FIG. 17 is a representative flowchart illustrating an embodiment of method of operation of a NN accelerator system 1600 featuring SONOS based NVM arrays/cells according to the present disclosure. In one embodiment, analog weight values (wi) and other constant values (e.g. b) are written to the SONOS based NVM arrays in the NN accelerator using methods described previously, in step 1702. In some embodiments, the NVM arrays may be refreshed on a regular basis for better retention and narrow $I_D/V_T$ sigma, in optional step 1712. Subsequently, NVM arrays of one accelerator may be configured to perform MAC operations based on at least digital inputs (xi) from other accelerators and its stored weight values, in step 1704. After MAC operations are completed, one accelerator may output its results and propagated to one or more connected accelerator as digital inputs of their own MAC operations, in step 1706. In one embodiment, steps 1704 and 1706 may be repeated for many times and in parallel mode. In step 1710, outputs may be transmitted to external devices, such as CPUs, GPUs, as results of neuromorphic computation in machine learning of an AI application.

Thus, embodiments of a SONOS based multi-level non-volatile memory and methods of operating the same as analog memory device and MAC device in a neuromorphic computing system, such as DNN have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A semiconductor device, comprising:
   a non-volatile memory (NVM) array including multi-level transistors that are charge-trapping based arranged in rows and columns, wherein the multi-level transistors are configured to store one of N×analog values corresponding to N levels of threshold voltage (VT) and drain current (ID), wherein N is a natural number greater than 2, and wherein at least one of the multi-level memory transistor are selected for a write process to a target value, wherein the target value is one of the N×analog values and corresponding to a target ID range extending from a target ID lower limit (LL) to a target ID upper limit (UL);
   a write circuitry configured to perform the write process including a partial program operation on the at least one of the multi-level memory transistors for ID level reduction and a partial erase operation on the at least one of the multi-level memory transistor for ID level raise; and
   a read circuitry configured to perform a first verification read after the partial program operation to determine how a reduced ID level is compared to a target ID mean, the read circuitry is further configured to perform a second verification read after the partial erase operation to determine how a raised ID level is compared to the target ID mean, and wherein the write process to the target value is determined to be completed when an ID level of the at least one of the multi-level memory transistors falls within the target ID range.

2. The semiconductor device of claim 1, wherein the multi-level transistors each includes a charge trapping nitride or oxynitride layer and the N×analog values correspond to amount of charges trapped therein.

3. The semiconductor device of claim 1, wherein the multi-level transistors each includes a metal gate layer disposed over a high-K dielectric gate dielectric layer.

4. The semiconductor device of claim 1, wherein the write circuitry is further configured to apply predetermined voltages to at least one of word lines, bit lines, and source lines during the partial program and partial erase operations, and wherein the word lines, bit lines, and source lines are coupled to the multi-level transistors.

5. The semiconductor device of claim 2, wherein the write circuitry is further configured, after the write process to the target value is completed, to inhibit the at least one of the multi-level memory transistors from further operations that change the ID level by reducing a magnitude of a voltage difference across the charge trapping nitride or oxynitride layer of the at least one of the multi-level memory transistors.

6. The semiconductor device of claim 1, wherein the partial program operation includes at least one of a soft program operation and a refill program operation, wherein the partial program operation is configured to reduce the ID level and raise a VT level of the at least one of the multi-level memory transistor, and wherein the partial erase operation includes at least one of a soft erase operation, a selective soft erase operation and an anneal erase operation, wherein the partial erase operation is configured to raise the ID level and reduce the VT level of the at least one of the multi-level memory transistors.

7. The semiconductor device of claim 1, wherein the partial program operation is performed for a considerable shorter duration than a program operation, wherein the program operation is configured to reduce ID levels of the multi-level memory transistors to a fully programmed ID level regardless of starting ID levels of the multi-level memory transistors.

8. The semiconductor device of claim 6, wherein the soft erase operation and the selective soft erase operation are performed for a considerable shorter duration than an erase operation, wherein the erase operation is configured to raise ID levels of the multi-level memory transistors to a fully erased ID level regardless of starting ID levels of the multi-level memory transistors.

9. The semiconductor device of claim 8, wherein the anneal erase operation is performed for a considerable longer duration than the erase operation, and wherein a magnitude of voltage difference across the charge trapping nitride or oxynitride layer of the at least one of the multi-level memory transistor during the erase operation is greater than the anneal erase operation.

10. The semiconductor device of claim 1, wherein the write circuitry is further configured, after the write process to the target value is completed, to perform a refill and anneal algorithm to maintain the ID level of the at least one of the multi-level memory transistors within the target ID range while replacing charges in shallow traps by charges in deep traps in the charge trapping nitride or oxynitride layer of the at least one of the multi-level memory transistors, wherein a refill program operation of the refill and anneal algorithm facilitates deep trap charges by applying a high voltage difference across the charge trapping nitride or oxynitride layer and a short program pulse to the at least one of the multi-level memory transistor, and wherein an anneal erase operation of the refill and anneal algorithm is configured to empty out shallow trap charges via Fowler Nordheim tunneling by applying a low voltage difference across the charge trapping nitride or oxynitride layer and a long erase pulse to the at least one of the multi-level memory transistor.

11. A semiconductor inference device, comprising:
a non-volatile memory (NVM) array including NVM cells arranged in rows and columns, wherein each NVM cell comprises a charge trapping transistor, and wherein each charge trapping transistor is configured to store one of N×analog values corresponding to N×levels of its drain current (ID) or threshold voltage (VT) levels, wherein the N×analog values stored represent N×weight values for multiply accumulate (MAC) operations, N being a natural number greater than 2;
digital-to-analog (DAC) function configured to receive and convert digital inputs from external devices, wherein each digital input is configured to cause a weight value stored in at least one NVM cell selected to be read;
multiplexor (mux) function configured to generate an analog MAC result based on the digital inputs converted results and the weight values read results; and
analog-to-digital (ADC) function configured to convert the analog MAC result of the mux function to a digital value and output the digital value.

12. The semiconductor inference device of claim 11, wherein two adjacent NVM cells are configured to store a single weight value, wherein the single weight value is based on analog values stored in the two adjacent NVM cells respectively, and wherein the single weight value has a range of 2×N.

13. The semiconductor inference device of claim 11, wherein the digital inputs include address information of the at least one NVM cell selected.

14. The semiconductor inference device of claim 11, wherein a plurality of the semiconductor inference devices are disposed on a same semiconductor die and communicatively coupled to one another, each of the plurality of the semiconductor inference devices configured to perform the MAC operations based on the weight values stored in the NVM cells and digital inputs from at least one other semiconductor inference device of the plurality of the semiconductor inference devices.

15. The semiconductor inference device of claim 14, wherein a first subset of the plurality of the semiconductor inference devices output digital results of MAC operations, and wherein the digital results of the first subset are coupled to a second subset of the plurality of the semiconductor devices as digital inputs thereto.

16. The semiconductor inference device of claim 14, wherein the plurality of the semiconductor inference devices are configured to function as artificial neurons in a deep neural network (DNN) performing neuromorphic computing in an artificial intelligence (AI) application.

17. A method to operate a multiply accumulate (MAC) device, comprising:
coupling a plurality of non-volatile memory (NVM) devices of the MAC device with a bus system, wherein each of the NVM device includes NVM cells arranged in rows and columns, and wherein each NVM cell comprises a charge trapping transistor configured to store one of N×analog values corresponding to N×levels of its drain current (ID) or threshold voltage (VT) levels, wherein the N×analog values stored represent N×multiply accumulate (MAC) weight values, N being a natural number greater than 2;

writing a weight value of the N×weight values to each NVM cell of the plurality of NVM devices;

receiving, at a first NVM device of the plurality of NVM devices, a set of digital inputs of (x1, x2, . . . , to xi), i being a natural number, through the bus system;

converting, using digital-to-analog (DAC) function, the set of digital inputs to a set of analog values;

outputting, based on the set of digital inputs, a set of weight values of (w1, w2, . . . , to wi) stored in corresponding NVM cells to a multiplexor function of the first NVM device;

generating an analog MAC result of the set of analog values and the set of MAC weight values of (x1$w$1+ x2$w$2+ . . . +xiwi);

converting the analog MAC result to a digital MAC value; and transmitting a digital MAC result that is based on the digital MAC value to a second NVM device, wherein the digital MAC result is one of a set of digital inputs for the second NVM device.

18. The method of claim 17, further comprising:
performing refresh operation on NVM cells of at least one of the plurality of NVM devices on a regular basis to verify that MAC weight values stored therein remain unchanged.

19. The method of claim 17, wherein the first NVM device is one of a first set of NVM devices and the second NVM device is one of a second set of NVM devices, and wherein digital MAC results outputted from the second set of NVM devices are not transmitted to the first set of NVM devices.

20. The method of claim 17, wherein the writing the weight value of the N×weight values includes:
performing a sequence of operations including at least one of a program, an erase, a partial program, a partial erase, a soft erase, a selective soft erase, an anneal erase, a refill program, and verifying read.

21. The method of claim 17, further comprising:
generating the digital MAC result based on the digital MAC value including:
adding a constant value to the digital MAC value; and
performing an activation function algorithm to a sum of the constant value and the digital MAC value.

* * * * *